United States Patent
Tamura et al.

[19]

[11] Patent Number: 6,031,694

[45] Date of Patent: *Feb. 29, 2000

[54] MAGNETIC HEAD WITH PROTECTIVE FILM COMPRISING AMORPHOUS $CAMGSI_2O_6$, $MG_2SIO_4$ AND/OR $MGAL_2O_4$

[75] Inventors: Takuo Tamura, Yokohama; Asao Nakano, Kamakura; Kazufumi Suenaga; Kiyoshi Ogata, both of Yokohama; Souzou Sasajima, Ibaraki-ken; Noriyuki Kumasaka, Oume, all of Japan

[73] Assignee: Hitachi, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/394,759

[22] Filed: Feb. 27, 1995

[30] Foreign Application Priority Data

Feb. 28, 1994 [JP] Japan .................................. 6-029988

[51] Int. Cl.[7] .................................................. G11B 5/187
[52] U.S. Cl. ............................................................ 360/122
[58] Field of Search ....................................... 360/110, 122

[56] References Cited

U.S. PATENT DOCUMENTS

| | | | |
|---|---|---|---|
| 5,050,027 | 9/1991 | Meunier et al. | 360/122 |
| 5,140,483 | 8/1992 | Koga et al. | 360/122 |
| 5,157,569 | 10/1992 | Kumasaka | 360/122 |

OTHER PUBLICATIONS

Cameron et al., Sep. 24, 1973, Chemical Abstracts, vol. 79, No. 12, Abstract No. 71036h, p. 318.

Finger et al., May 17, 1976, Chemical Abstracts, vol. 84, No. 20, Abstract No. 143197q, p. 537.

*Primary Examiner*—Daid D. Davis
*Attorney, Agent, or Firm*—R. William Beard, Jr.; Frohwitter

[57] ABSTRACT

A protective film which is close to a substrate of a magnetic head in term of thermal expansion coefficient and hardness when it is placed on a slide face of the magnetic head, and moreover is made of material which is high stability in water and enables the film to be formed at high speed. The protective film contains a region of composition $CaMgSi_2O_6$ at least in a part thereof. Ca atom is surrounded by O atoms with the coordination number of eight, Mg is surrounded by O atoms with the coordination number of six, and Si is surrounded by O atoms with the coordination number of four in the atomic configuration in the region.

16 Claims, 20 Drawing Sheets

1nm

Ca ATOM EXISTS AT THE CENTER OF OCTAHEDRON A AND O ATOM EXISTS AT EACH VERTEX.

Mg ATOM EXISTS AT THE CENTER OF HEXAHEDRON B AND O ATOM EXISTS AT EACH VERTEX.

Si ATOM EXISTS AT THE CENTER OF TETRAHEDRON C AND O ATOM EXISTS AT EACH VERTEX.

Mg₂SiO₄

STRUCTURE OF MgAl₂O₄ (SPINEL TYPE STRUCTURE)

STRUCTURE OF Mg₂SiO₄ (NESOSILICATE TYPE STRUCTURE)

Ca ATOM EXISTS AT THE CENTER OF OCTAHEDRON M1, M2 AND O ATOM EXISTS AT EACH VERTEX.

Si ATOM EXISTS AT THE CENTER OF TETRAHEDRON M3 AND O ATOM EXISTS AT EACH VERTEX.

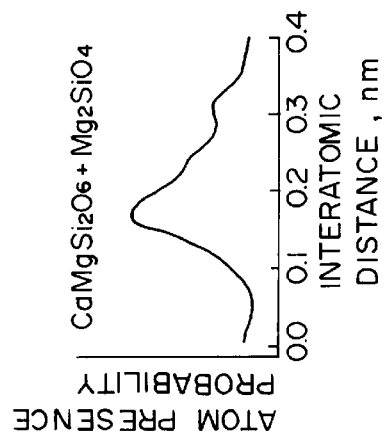
FIG. 23A CaMgSi₂O₆
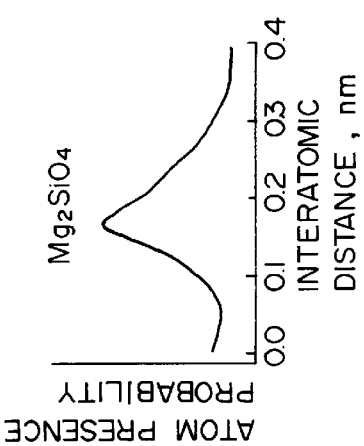
FIG. 23B Mg₂SiO₄
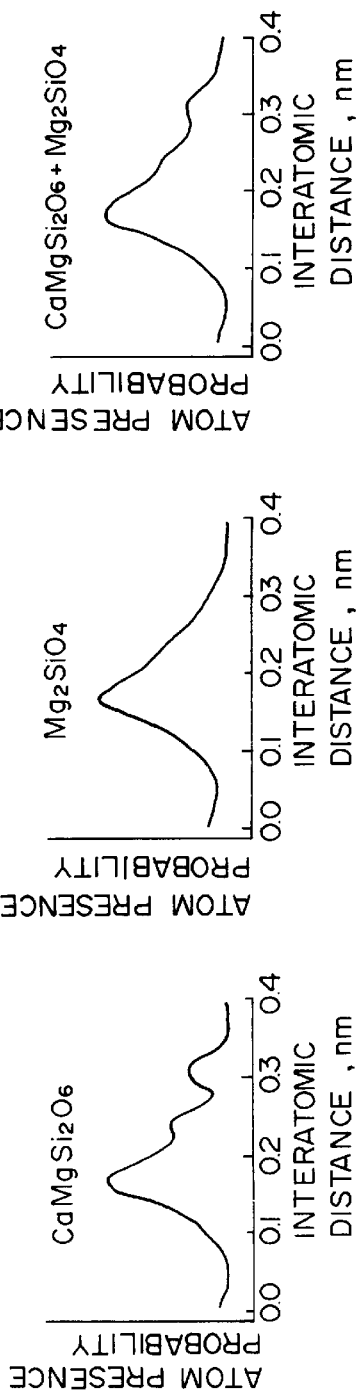
FIG. 23C CaMgSi₂O₆ + Mg₂SiO₄
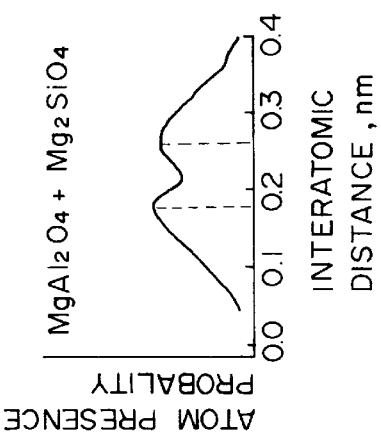
FIG. 24A MgAl₂O₄
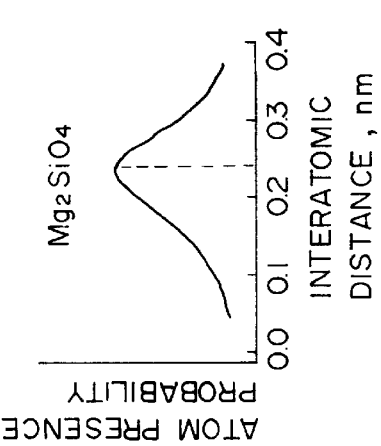
FIG. 24B Mg₂SiO₄
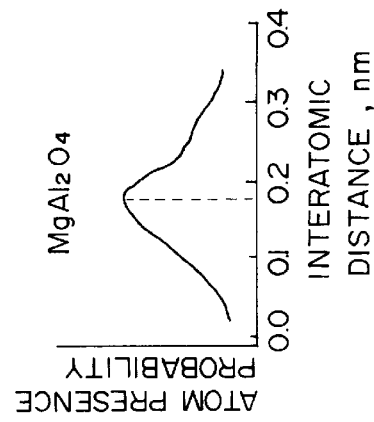
FIG. 24C MgAl₂O₄ + Mg₂SiO₄

MAGNETIC HEAD WITH PROTECTIVE FILM COMPRISING AMORPHOUS CAMGSI$_2$O$_6$, MG$_2$SIO$_4$ AND/OR MGAL$_2$O$_4$

BACKGROUND OF THE INVENTION

1. Field of the Invention

This invention relates to material appropriate for protective films and to a magnetic head comprising a protective film made of the material.

2. Description of the Related Art

Hitherto, protective films of magnetic heads, thin film elements, etc., have been formed on the elements to be protected by using thin film formation technology.

For example, with conventional inductive magnetic heads, a protective film is placed on a slide face with a magnetic recording medium, in order to prevent abrasion of a detection section formed by a core and gap. Specifically, a protective film is formed by thin film formation technology such as sputtering on a substrate, such as a ceramic, on which a magnetic film forming a core and a nonmagnetic film forming a gap are laminated.

The requirements for the protective films to exhibit sufficient protection performance often include a small thermal expansion coefficient difference, a small hardness difference, etc., between the protective film and the object to be protected, in addition to excellent hardness and high stability in water of the protective films.

For example, it is desired that a protective film placed on the slide face of a magnetic head provides a small thermal expansion coefficient difference between a substrate and the protective film, the same degree of hardness as the substrate, fast film formation speed, excellent stability in water, etc.

Hitherto, materials such as SiO$_2$ glass, glass phosphate, alumina, tantalum oxide, silicon carbide, and forsterite have been used for such magnetic head protective films. The materials are reported in Japanese Patent Laid-Open Nos. Sho 58-26308, 61-24007, and 63-241711 and Hei 4-344307.

However, if conventional SiO$_2$ glass, glass phosphate, alumina, tantalum oxide, or silicon carbide is used as a magnetic head protective film, any of the following problems may arise:

First problem: Since the thermal expansion coefficient difference between a substrate and protective film is large, a large stress is caused by a thermal history. Thus, a crack occurs not only on the protective film but also on the substrate on the core.

Second problem: Since the hardness difference between a substrate and core and a protective film is large, partial abrasion occurs between the substrate and core and protective film when the slide face of a magnetic head is ground or when the magnetic head and magnetic recording medium slide with each other.

Third problem: When protective films are made of the above mentioned materials, it takes a long time to form the film and time; the materials are not conducive to mass production at low cost.

If forsterite is used as a magnetic head protective film, it provides more advantageous characteristics than the above-mentioned materials with respect to the thermal expansion coefficient, hardness, and film formation speed, but it is unstable in water and is altered in quality due to grinding fluid applied during a grinding process so that the advantageous features degrade.

SUMMARY OF THE INVENTION

It is therefore an object of the invention to provide protective films which have low stress caused by a thermal history and high stability in water and which can prevent partial abrasion of a slide face and can be formed at high speed when they are used as protective films of magnetic heads, and to provide materials appropriate for forming the protective films.

To these ends, according to the first aspect of the invention, there is provided a protective film for protecting an object, the protective film containing a region of composition CaMgSi$_2$O$_6$ at least in a part thereof, wherein Ca atom is located at the position surrounded by eight O atoms, which is called as the coordination number of eight, Mg atom is located at the position surrounded by O atoms, which is called as the coordination number of six, and Si atom is located at the position surrounded by O atoms, which is called as the coordination number of four in the atomic configuration in the region.

According to the second aspect of the invention, there is provided a protective film for protecting an object, the protective film containing a region of composition MgAl$_2$O$_4$ at least in a part thereof, wherein Mg atom is surrounded by O atoms with coordination number of four and Al atom is surrounded by O atoms with coordination number of six in the atomic configuration in the region.

The inventors found by experiment that the protective films of the invention more stable in water and moreover are formed at high speed. Further, the protective films are close to materials generally widely used as substrates of magnetic heads in terms of thermal expansion coefficient and hardness.

Therefore, the protective films are placed on the slide face of the magnetic head, whereby a crack on the protective film or peeling-off of the protective film is made difficult to occur and partial abrasion can be prevented. The protective films, which are more stable in water, degrade only slightly, even if the slide face is polished with an aqueous solvent. Since the protective films are formed at high speed, manufacturing costs of the magnetic heads can be reduced.

BRIEF DESCRIPTION OF THE DRAWINGS

In the accompanying drawings:

FIG. 23A is a graph showing the radial distribution of Si atoms of the protective film 5 according to the third embodiment of the invention;

FIG. 23B is a graph showing the radial distribution of Si atoms of the protective film 5 according to the third embodiment of the invention;

FIG. 23C is a graph showing the radial distribution of Si atoms of the protective film 5 according to the third embodiment of the invention;

FIG. 24A is a graph showing the radial distribution of Mg atoms of the protective film 5 according to the fourth embodiment of the invention;

FIG. 24B is a graph showing the radial distribution of Mg atoms of the protective film 5 according to the fourth embodiment of the invention;

FIG. 24C is a graph showing the radial distribution of Mg atoms of the protective film 5 according to the fourth embodiment of the invention;

DESCRIPTION OF THE PREFERRED EMBODIMENTS

Figure 1A:
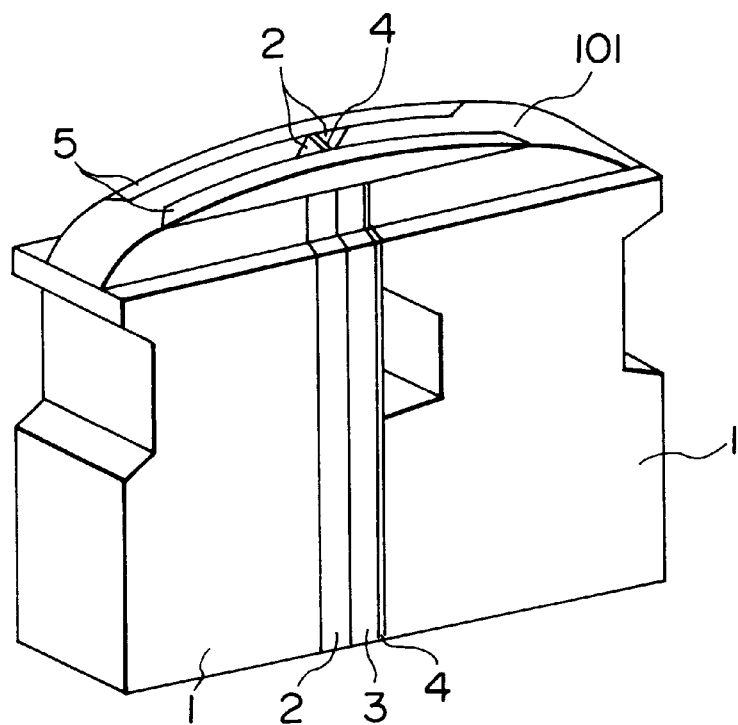
FIGS. 1A and 1B are a perspective view and a top view, respectively, to show the structure of a magnetic head of a first embodiment of the invention.

Referring now to the accompanying drawings, there are shown preferred embodiments of the invention.

First, the configuration of a recording and reproducing apparatus comprising magnetic heads of the invention will be discussed with reference to FIG. 31.

The recording and reproducing apparatus 201 comprises a recording and reproducing mechanism 202, which runs tape 204 along a predetermined run passage for recording and reproducing, and a drive microcomputer 208, which controls the operation of the recording and reproducing mechanism 202. The drive microcomputer 208 is connected to, and controlled by, a control microcomputer 207.

The recording and reproducing apparatus 201 further includes a recording circuit 210 for transferring record signals to and from the recording and reproducing mechanism 202 and a reproducing circuit 209 for receiving signals reproduced by the recording and reproducing mechanism 202. An external host computer 205 is connected via an interface 206 to the control microcomupter 207. The reproducing circuit 209 is connected to the control microcomputer 207 and the interface 206. The recording circuit 210 is connected to the control microcomputer 207.

Next, the operation of the recording and reproducing apparatus 201 will be discussed.

The host computer 205 transfers data to be recorded to the control microcomputer 207 via the interface 206. The control microcomputer 207 sends the data to the recording circuit 210 and causes the recording circuit 210 to record the data on the tape 204. At the same time, the control microcomputer 207 causes the reproducing circuit 209 to reproduce the recorded data, then reads and verifies the data. If an error occurs, the control microcomputer 207 again causes the recording circuit 210 to record the data.

The configuration of the recording and reproducing mechanism 202 will be discussed.

The recording and reproducing apparatus 201 comprises a rotary head unit 213 having heads 203a, 203b, 203c, and 203d. The heads 203a and 203b are placed in the same +azimuth configuration and the heads 203c and 203d are placed in the same −azimuth configuration. As shown in FIG. 31, the heads 203a and 203c are connected to the recording circuit 210 and the heads 203b and 203d are connected to the reproducing circuit 209.

The recording and reproducing mechanism 201 further includes a supply reel motor 251 for rotating a supply reel 253 of a cassette 214 and a rewind reel motor 252 for rotating a rewind reel 254. The reel motors 251 and 252 are connected to the drive microcomputer 208.

Guide rollers 222 and 203 are placed in order between the cassette 214 and the rotary head unit 213 for guiding the tape 204 unreeled from the supply reel 253 along the predetermined run passage and winding the tape 204 on the rotary head unit 213.

The operation of the recording and reproducing mechanism 202 will be discussed.

Figure 31:
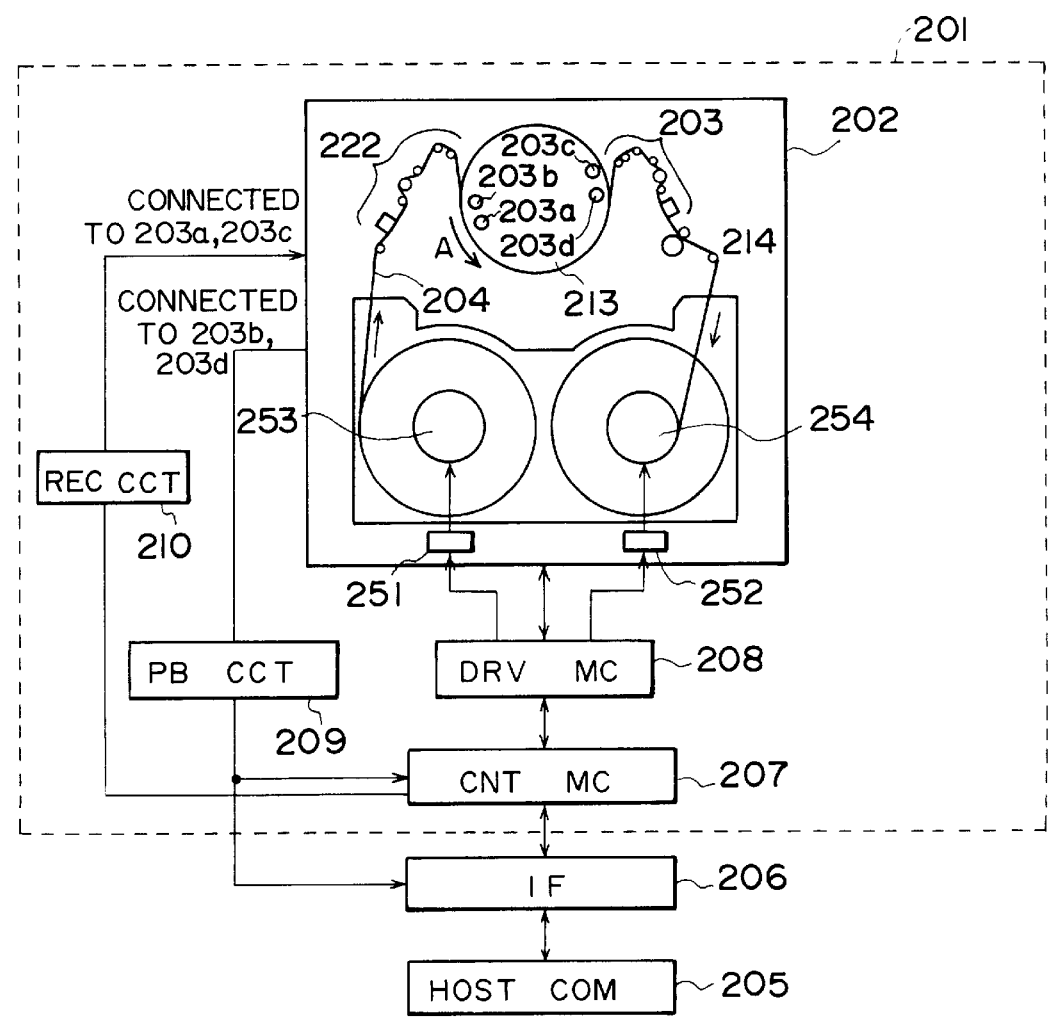
FIG. 31 is a block diagram showing the configuration of a recording and reproducing apparatus of the invention.
Figure 32:
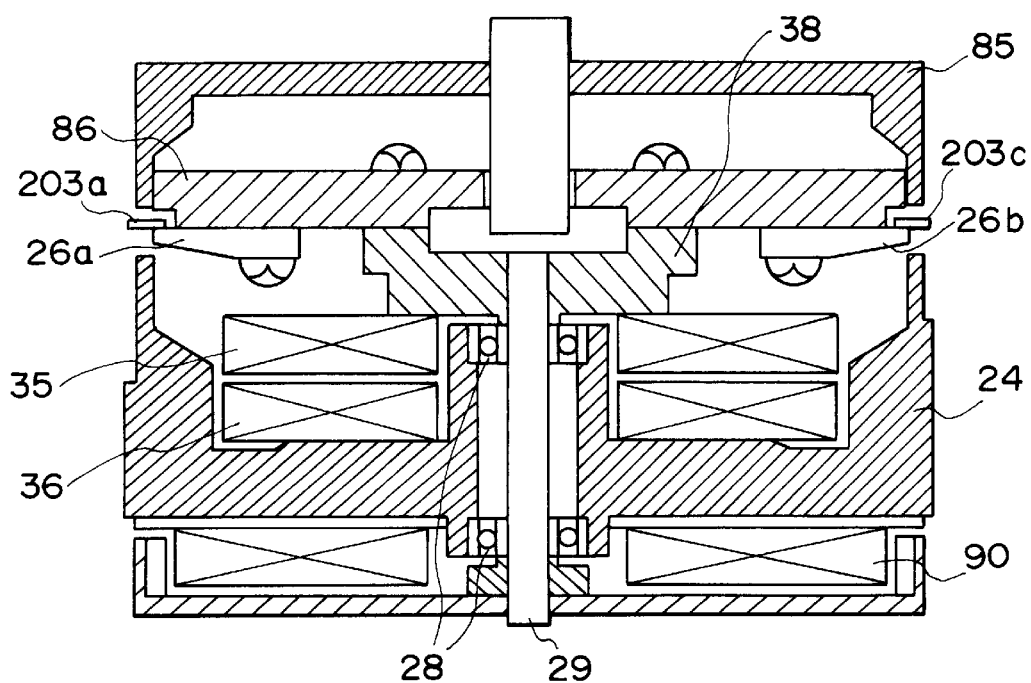
FIG. 32 is a sectional view of a rotary head unit of the recording and reproducing apparatus in FIG. 31.

The rotary head unit 213 is driven by a drum motor 90 shown in FIG. 32 and rotates in the A direction shown in FIG. 31. The operation of the drum motor 90 is controlled by the drive microcomputer 208. The tape 204 runs at a constant speed. It is recorded by the heads 203a and 203c of the rotary head unit 213 and is reproduced by the heads 203b and 203d.

The structure of the rotary head unit 213 will be further discussed with reference to FIGS. 32 and 33. The rotary head unit 213 has a structure where the heads rotate between upper and lower fixed drums for winding the tape 204.

Figure 33:
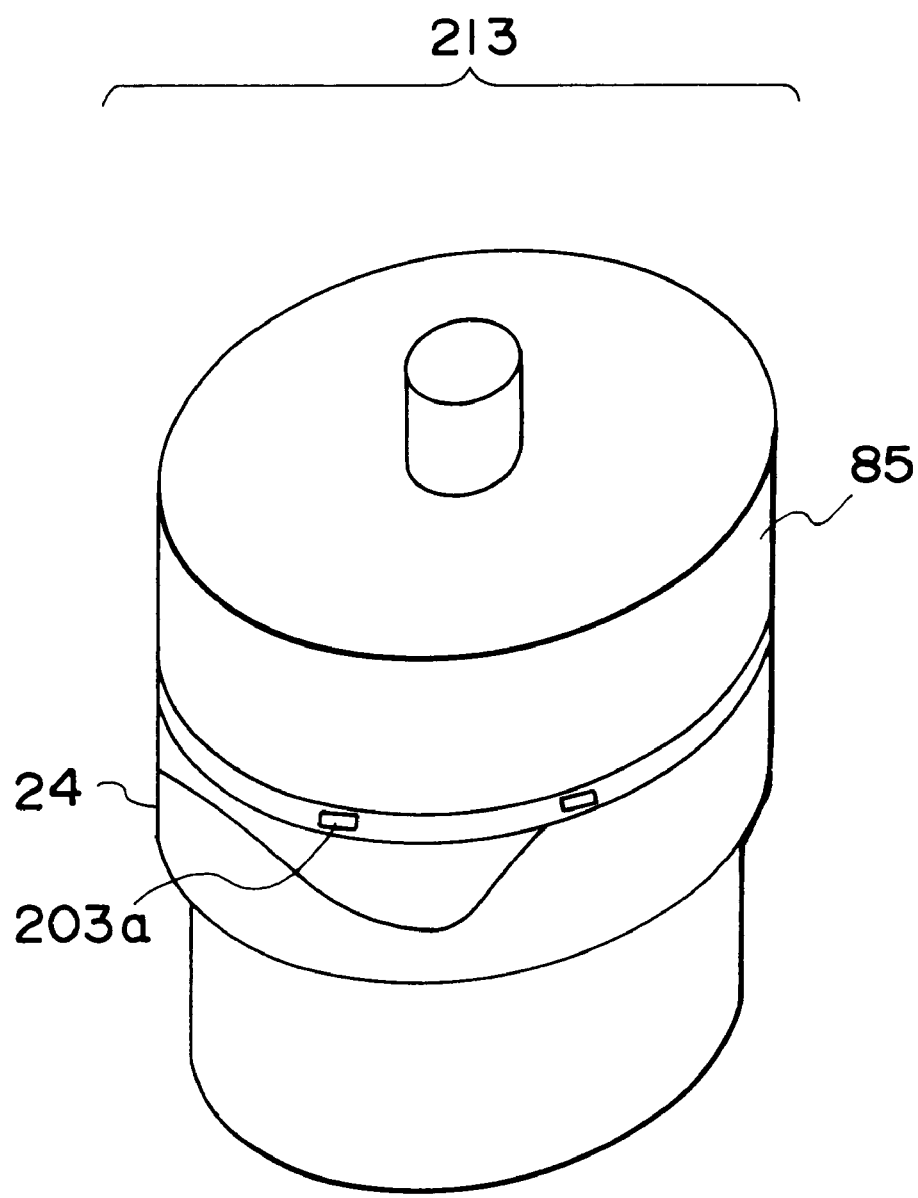
FIG. 33 is a perspective view of the rotary head unit of the recording and reproducing apparatus in FIG. 31.

FIG. 32 is a sectional view of the rotary head unit 213 and FIG. 33 is a perspective view thereof. As shown in FIG. 32, the rotary head unit 213 comprises a lower fixed drum 24, an intermediate rotary drum 86, and an upper fixed drum 85 overlaid on each other. Two bearings 28 are pressed into the center of the lower fixed drum 24. A rotary transformer stator 36 is fixed to the lower fixed drum 24. A rotation shaft 29 is pivotally supported by the two bearings 28.

As shown in FIG. 31, the four heads 203a, 203b, 203c, and 203d are fixed on the outer peripheral surface of the intermediate rotary drum 86. Further, the intermediate rotary drum 86 is linked with a disk 38 into which the rotation shaft 29 is pressed. A rotary transformer rotor 35 is fixed to the disk 38. The rotation shaft 29 has one end fixed to the drive motor 90 which rotates and drives the disk 38 and the intermediate rotary drum 86. Further, a wiring board (not shown) for electrical connection of the rotary transformer rotor 35 and the head 203a, etc., is fixed to the intermediate rotary drum 86. The drive motor 90 rotates the intermediate rotary drum 86, whereby the heads 203a, etc., fitted to the intermediate rotary drum 86 scan the tape wound on the upper and lower fixed drums 85 and 24 for recording and reproducing.

As a first embodiment of the invention, a magnetic head comprising protective films on a slide face, used as the magnetic head 203a, 203b, 203c, 203d of the recording and reproducing apparatus described above, will be discussed.

The magnetic head of the first embodiment is a magnetic head formed using a composite thin film. As shown in FIG. 1A, a pair of magnetic cores 2 which are placed with a gap film 4 therebetween are sandwiched in, and supported by, a substrate 1. The cross sections of the magnetic cores 2 and the gap film 4 are exposed to a slide face 101, making up a detection section 102 for detecting magnetism of a magnetic recording medium. A pair of protective films 5 are embedded in the slide face 101 so as to sandwich the detection section 102 therebetween. Therefore, a part of the substrate 1, the detection section 102, and the protective films are exposed to the slide face 101. The slide face 101 is worked like a curved surface by polishing. The magnetic core 2, the gap film 4, and a nonmagnetic embedded member 3, placed for convenience of a manufacturing process, are exposed to the side of the magnetic head.

In the embodiment, a $(Mn, Zn)\ Fe_2O_4$ substrate of a nonmagnetic ferrite or ceramics of a nonmagnetic ferrite is used as the substrate 1, where $(Mn, Zn)\ Fe_2O_4$ is material provided by replacing one Fe atom of $Fe_3O_4$ with Mn or Zn. Moreover, $(Mn, Zn)Fe_2O_4$ contains both Mn and Zn. The magnetic cores 2 are made of a Co family (for example, CoNbZr family) amorphous alloy. The nonmagnetic embedded member 3 and the gap film 4 are made of nonmagnetic insulation material such as $SiO_2$ and $Al_2O_3$. The magnetic cores 2 can be made of not only a Co family (for example, CoNbZr family) amorphous alloy, but also an Fe amorphous or crystalline alloy, sendust, permalloy, etc.

The protective films 5 will be discussed.

Figure 3:
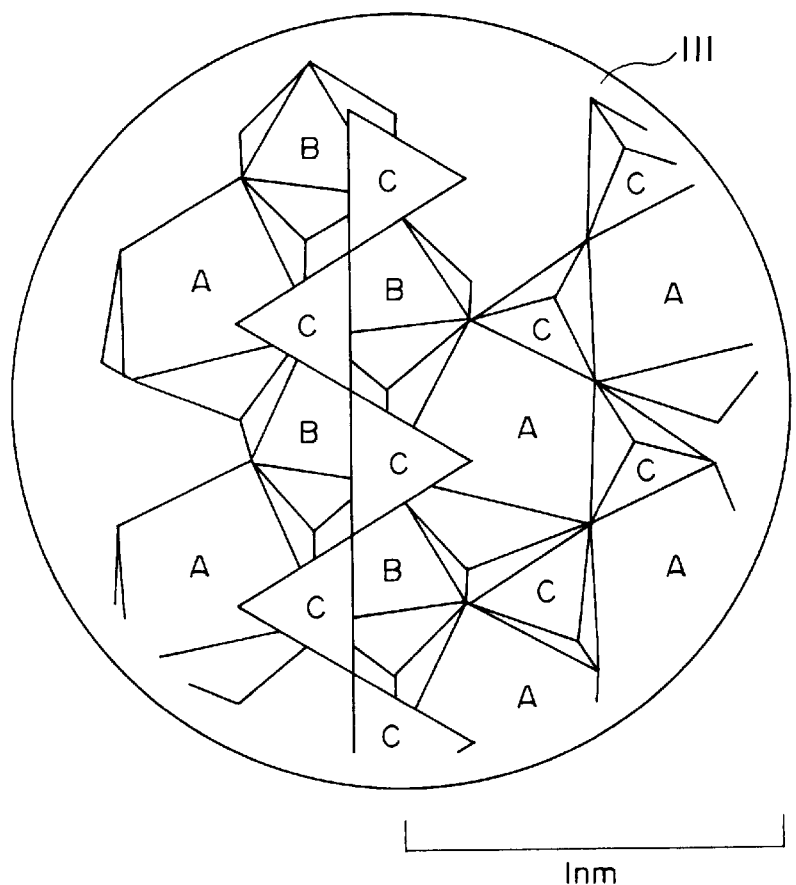
FIG. 3 is an illustration showing the structure of a microcluster contained in a protective film 5 of the magnetic head in FIGS. 1A and 1B.

The protective film 5 is a film containing Ca, Mg, Si, and O. Moreover, it contains a minute region of composition $CaMgSi_2O_6$. The atomic configuration in the region is a structure of inosilicate type as shown in FIG. 3. The minute region is about 1–10 nm in diameter. Generally, a crystal having composition $CaMgSi_2O_6$ and inosilicate type structure is called diopside. However, when X-ray diffraction measurement is applied to the protective films 5 of the embodiment, a diffraction line showing a crystal is not observed, thus the entire protective film 5 is amorphous and the region is too small to be called a diopside crystal. Therefore, in the embodiment, the region is referred to as a microcluster.

The structure of the microcluster 111 contained in the protective film 5 will be further discussed with reference to FIG. 3. The microcluster 111 is the atomic configuration of inosilicate type, as shown in FIG. 3. Each Si atom is located at the position surrounded by four O atoms, which is called that the coordination number is four. Each Ca atom is located at the position surrounded by eight O atoms, which is called that the coordination number is eight. Each Mg atom is located at the position surrounded by six O atoms, which is called that the coordination number is six. $SiO_4$ tetrahedra are connected like a chain and Ca and Mg are placed therebetween.

Figure 1B:
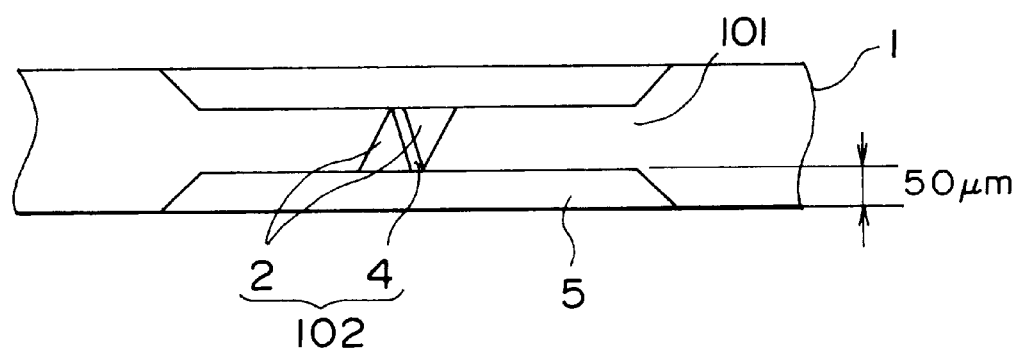

Next, a manufacturing method of the magnetic head in FIG. 1 will be discussed.

Figure 9A:
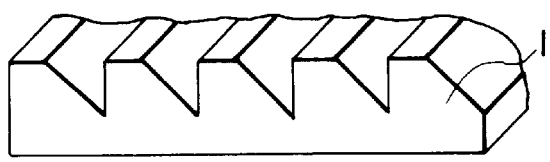
FIGS. 9A to 9F are illustrations showing manufacturing steps of the magnetic head in FIGS. 1A and 1B.
Figure 9B:
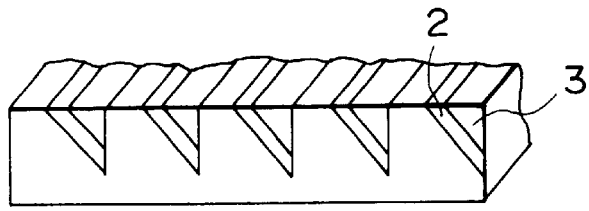
Figure 9C:
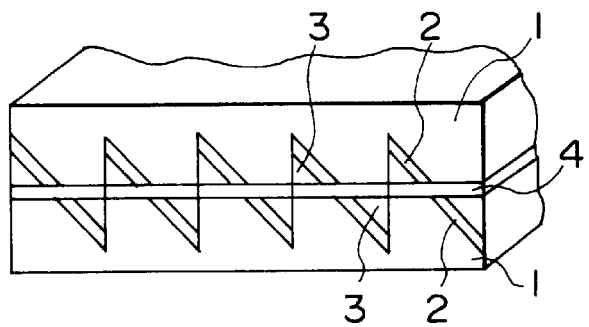

First, one substrate 1 formed with V grooves as shown in FIG. 9A is provided, a film as the magnetic core 2 is formed on one inner wall of the V groove, and the V groove is filled with the nonmagnetic embedded member 3 (FIG. 9B). The gap film 4 is formed on the substrate 1. This substrate 1 and another substrate 1 in the condition shown in FIG. 9B are bonded together by the gap film so that the V grooves are placed in a staggered configuration (FIG. 9C).

Figure 9D:
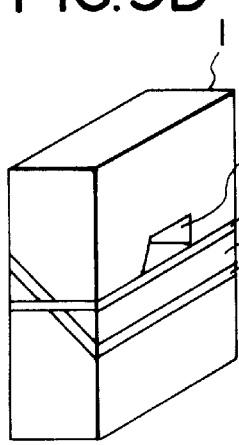
Figure 9E:
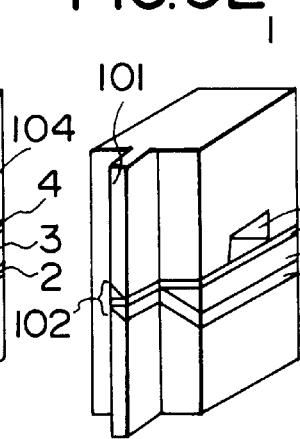
Figure 9F:
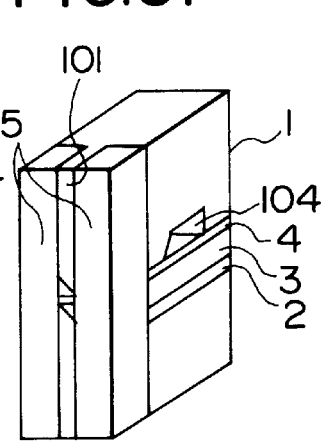

Next, the two substrates 1 bonded together are cut for each V groove (FIG. 9D) and a through hole 104 for winding a coil is made. Further, a recess is formed in each end of the slide face 101 (FIG. 9E) so as to sandwich the detection section 102 and the protective films 5 are formed so as to fill the recesses (FIG. 9F). Further, the slide face 101 is polished with abrasive grains dispersed in an aqueous solvent for contouring it to a curved surface as shown in FIG. 1A and the side of the substrate 1 is also cut. A coil is wound around the through hole 104 to complete the magnetic head.

Formation methods of the thin films will be discussed.

The magnetic cores 2, the nonmagnetic embedded member 3, the gap film 4, and the protective films 5 are formed by the sputtering method.

Figure 2:
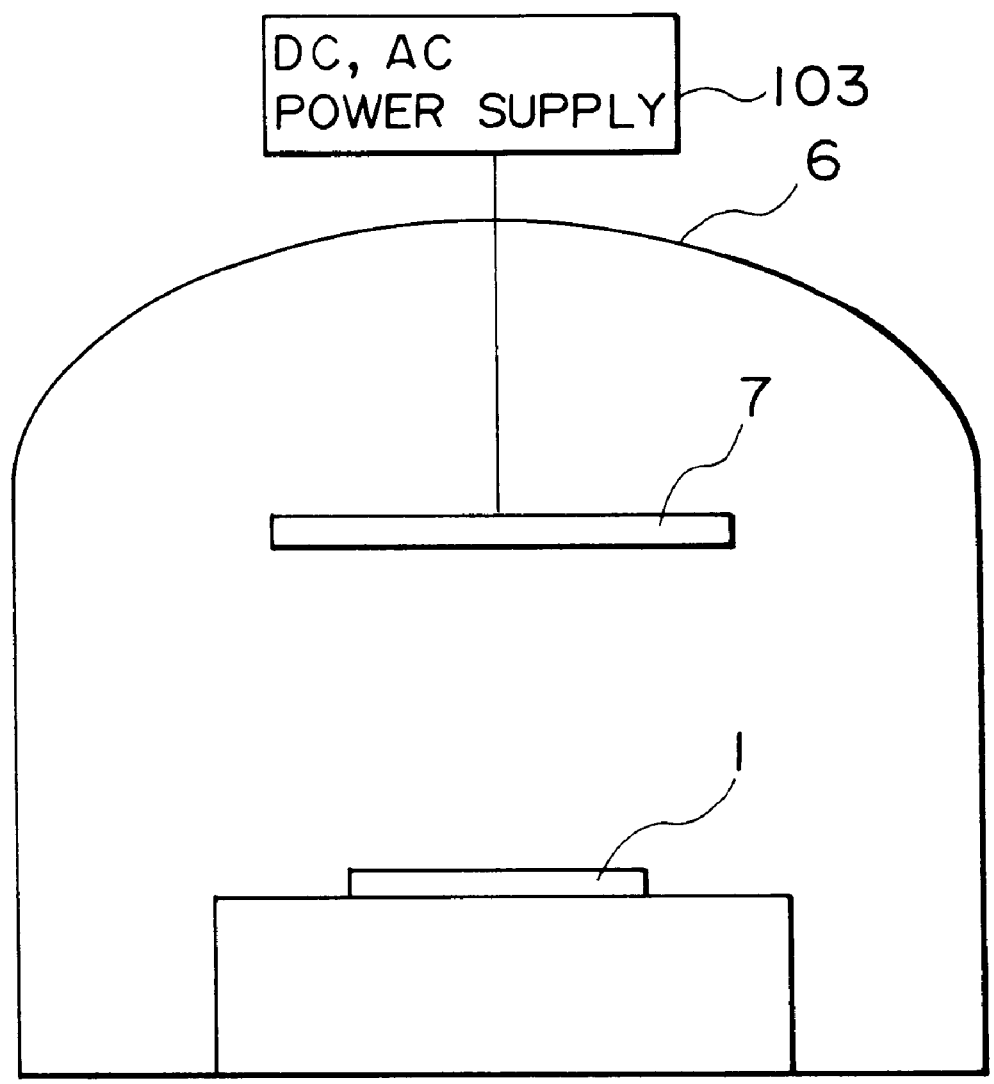
FIG. 2 is an illustration of a sputtering system used for manufacturing the magnetic head in FIGS. 1A and 1B.

In a sputtering system used for forming the films, as shown in FIG. 2, the substrate 1 is placed in a vacuum tank 6, a target 7 is positioned opposite to the substrate 1, and a power supply 103 for supplying DC or AC power, particularly high-frequency power, to the target 7 is connected to the target 7. A water cooler (not shown) for cooling the substrate 1 is fitted to a holder (not shown) for holding the substrate 1. Gases such as argon are supplied to the vacuum tank 6 as sputter gases. In the system, the material of the target 7 is decomposed to the atomic level, sublimated, and deposited on the substrate 1 for film formation.

The magnetic cores 2, the nonmagnetic embedded member 3, and the gap film 4 are made of conventional material used for magnetic heads and the film formation conditions are well known. Therefore, the film formation method will not be discussed here.

Next, the film formation method of the protective films 5 will be described.

A polycrystalline sinter of diopside (composition $CaMgSi_2O_6$) is used as the target 7. While the substrate 1 is cooled in water, the protective film 5 is formed using a sputtering process in the sputtering system with sputter power 650 W and at Ar gas pressure 0.15 Pa. The film formation speed under these conditions is about 1.5 $\mu$m/hour, which is three times or more as fast as the alumina film formation speed.

When the average composition of the entire protective film 5 is analyzed by fluorescent X-ray analysis, it is found to be approximately $Ca_{1.1}Mg_{0.9}Si_2O_6$. The thermal expansion coefficient and Vickers hardness of the protective film 5 are measured using a film specimen having about 50 $\mu$m thickness, about 100 mm×100 mm area, formed under the same conditions. As a result, it is found that the protective film 5 has thermal expansion coefficient $110 \times 10^{-7}/°$ C. and Vickers hardness 700–750/mm$^2$, which are values very close to the thermal expansion coefficient $115 \times 10^{-7}/°$ C. and Vickers hardness 650/mm$^2$ of (Mn, Zn) $Fe_2O_4$ of the substrate 1.

The amorphous structure of the protective film 5 formed under these conditions is analyzed.

Generally, when a thin film contains a crystal, it is known that the average particle diameter of the crystal and the crystallization state can be approximately estimated by executing X ray or electron beam diffraction measurement. When phases of scattering caused by atoms are uniform, X ray or electron beam diffraction occurs in accordance with the Bragg's law shown in Expression (1) that follows. Thus, the diffraction strength like a sharp peak is observed at a specific interatomic plane spacing d.

$$2d \cdot \sin \theta = \lambda \quad (1)$$

where $\theta$ denotes a diffraction angle and $\lambda$ denotes the X ray or electron beam wavelength.

The relationship between the X ray diffraction peak width and the average diameter of crystal grains causing diffraction, $\eta$, is as represented in Expression (2).

$$\eta = (\lambda \cdot \tan \theta)/(0.9 \cdot \Delta \theta) \quad (2)$$

As the crystallization degree lowers, the average diameter of crystal grains lessens. Thus, the diffraction strength peak width widens.

Generally, when a thin film is an amorphous substance, it is known that the structure at atomic level centering on the object atom can be found by executing an X-ray absorption fine structure (XAFS) analysis method, which is a method of applying X-rays to a substance, measuring the X-ray absorption spectrum, and analyzing the X-ray absorption spectrum form for finding the atomic level structure of the substance. When X-rays are applied to the substance, core electrons of atoms are excited and photo-electrons sublimate. The sublimating photo-electron wave is scattered by surrounding atoms and interferes with the original photo-electron wave. This interference affects the X-ray absorption rate. Surrounding structure information of any desired element can be provided by selecting X-ray energy exciting the atoms. Specifically, the interatomic distance is found from the X-ray absorption spectrum vibration period and coordination number information is provided from the vibration amplitude.

The XAFS is described in Japan Physical Society Journal Vol. 34, No.7 (1979), pp 589–598, Physical Review B Vol. 11, No. 8 (1975), pp 2795–2811, etc., for example.

When the above-mentioned specimen of the protective film 5 is measured by the X-ray diffraction method, no diffraction peak is observed. Thus, the structure is further analyzed by the XAFS method. However, the specimen used for the X-ray diffraction method measurement and the XAFS method measurement is a film formed on a nonmagnetic substrate under the same thin film formation conditions as the protective film 5.

Figure 4:
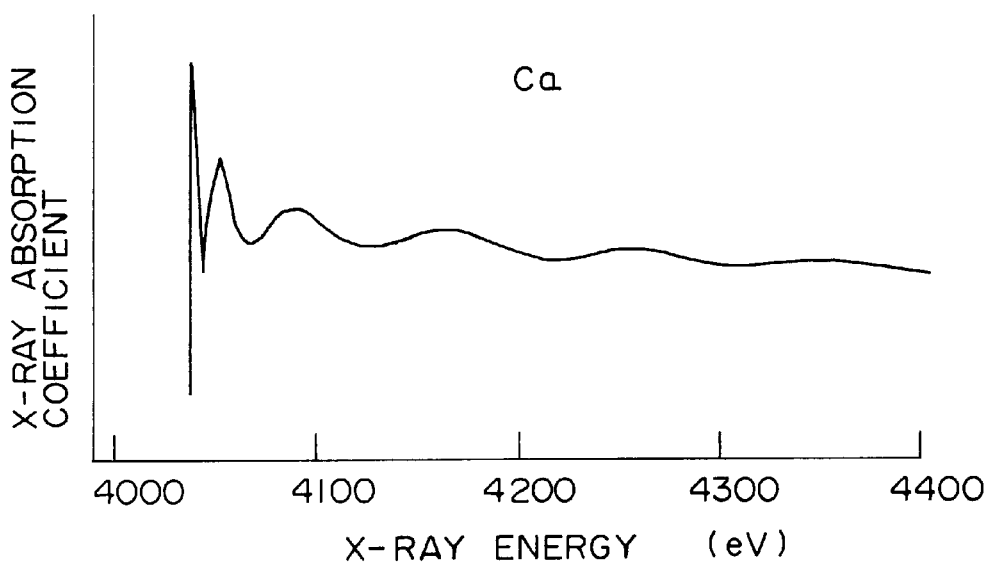
FIG. 4 is a graph showing the X-ray absorption spectrum of Ca atoms of the protective film 5 of the magnetic head in FIGS. 1A and 1B.
Figure 5:
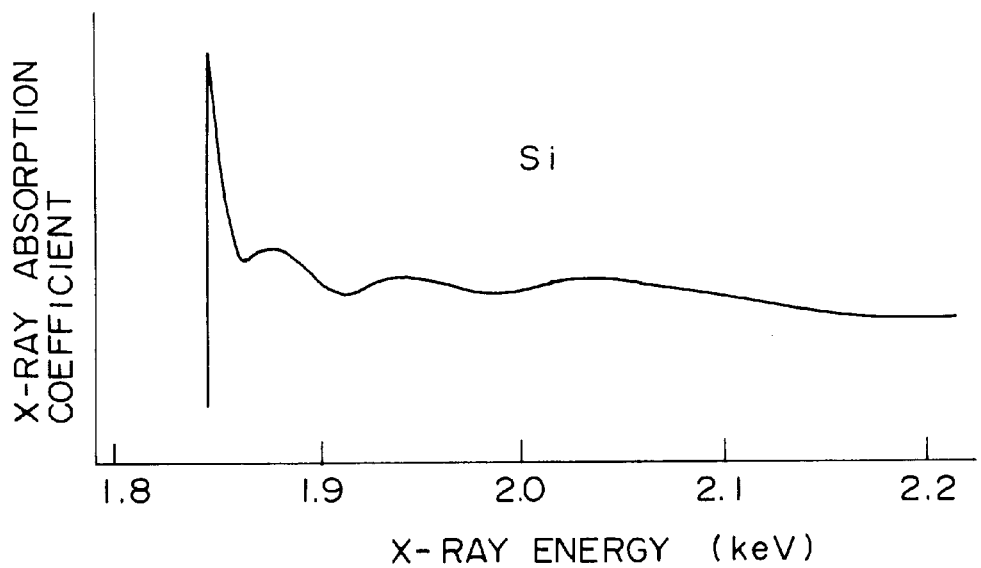
FIG. 5 is a graph showing the X-ray absorption spectrum of Si atoms of the protective film 5 of the magnetic head in FIGS. 1A and 1B.

FIGS. 4 and 5 show the XAFS measurement results in the embodiment. FIG. 4 is a graph showing an X-ray absorption spectrum measured in the vicinity of the K-X-ray absorption edge of Ca for analyzing the surrounding structure of the Ca atom. FIG. 5 is a graph showing an X-ray absorption spectrum measured in the vicinity of the K-X-ray absorption edge of Si for analyzing the surrounding structure of the Si atom. The X-ray absorption edge refers to the wavelength at which the absorption rapidly decreases when the X-ray energy is reduced in the X-ray absorption spectrum. The X-ray absorption edge appears in each of the K shell, L shell, etc., of an atom. FIGS. 4 and 5 are each graphs of the absorption spectrum appearing in the vicinity of the absorption edge when K shell electrons are excited.

The atomic level structure of the specimen of the protective film 5 is analyzed based on the vibration periods and vibration amplitudes of the X-ray absorption spectra in FIGS. 4 and 5. The analyzed result will be discussed with reference to FIGS. 6 and 7.

Figure 6:
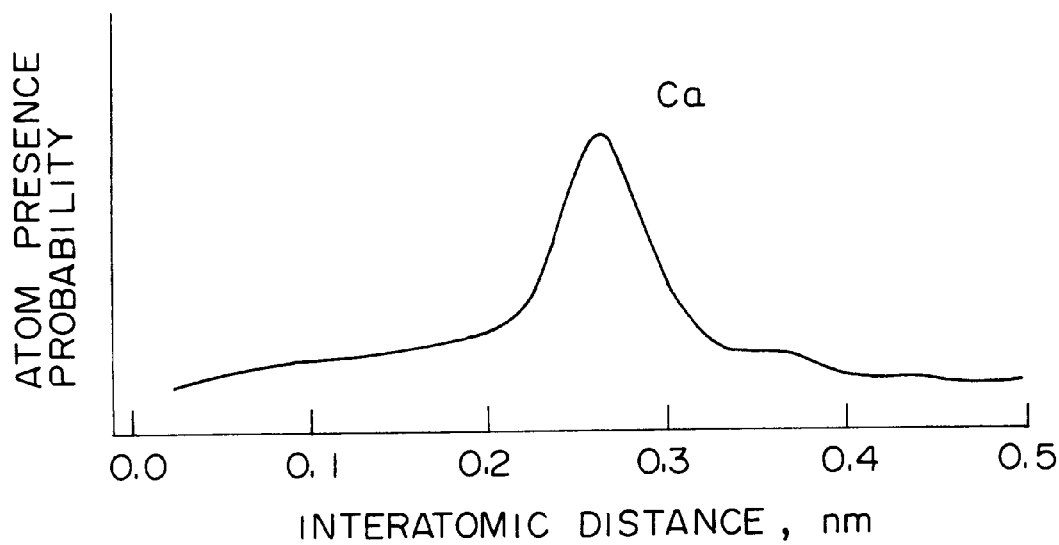
FIG. 6 is a graph showing the radial distribution of Ca atoms of the protective film 5 of the magnetic head in FIGS. 1A and 1B.

FIG. 6 shows a radial distribution function centering on the Ca atom found from FIG. 4. The radial distribution function indicates that the Ca atom is connected to O atoms with the coordination number of eight, from the radial distributions or interatomic distances.

Figure 7:
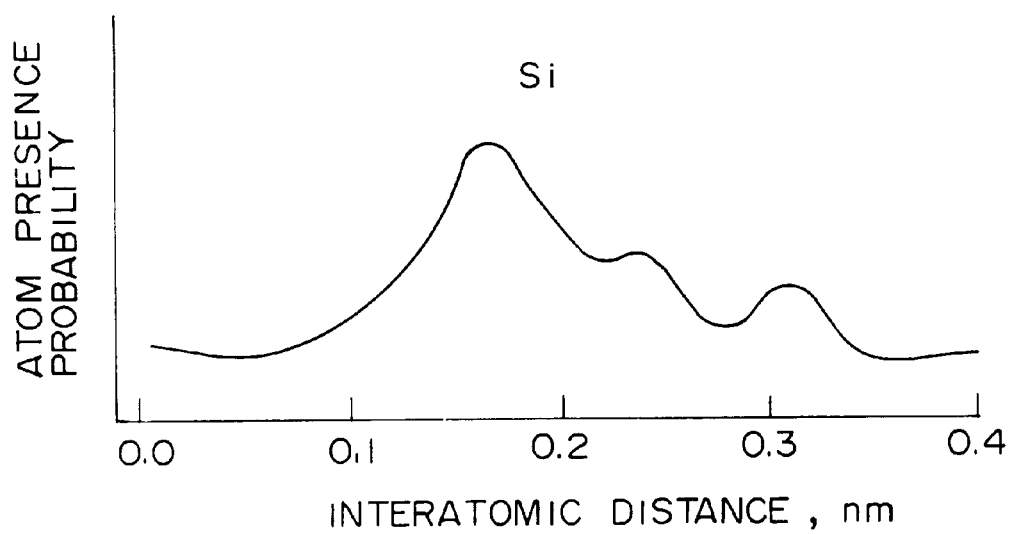
FIG. 7 is a graph showing the radial distribution of Si atoms of the protective film 5 of the magnetic head in FIGS. 1A and 1B.

On the other hand, FIG. 7 is a radial distribution function centering on the Si atom found from FIG. 5. The radial distribution function indicates that the Si atom is connected to O atoms with the coordination number of four and that $SiO_4$ tetrahedra are like a chain from the radial distributions or interatomic distances.

From the analyses, we find that a region of an inosilicate type structure with composition $CaMgSi_2O_6$ exists in the specimen of the protective film 5 of the embodiment and is 1–10 nm in diameter.

Also, the specimen of the protective film 5 of the embodiment is soaked in hot water at 80° C. for 10 hours, and the structure is then analyzed by the X-ray diffraction method and the XAFS method. As a result, the structure changes little compared with that before the hot water treatment, and the thermal expansion coefficient and hardness also change little compared with those before the hot water treatment. This indicates that the protective film 5 has excellent stability in water.

Figure 8:
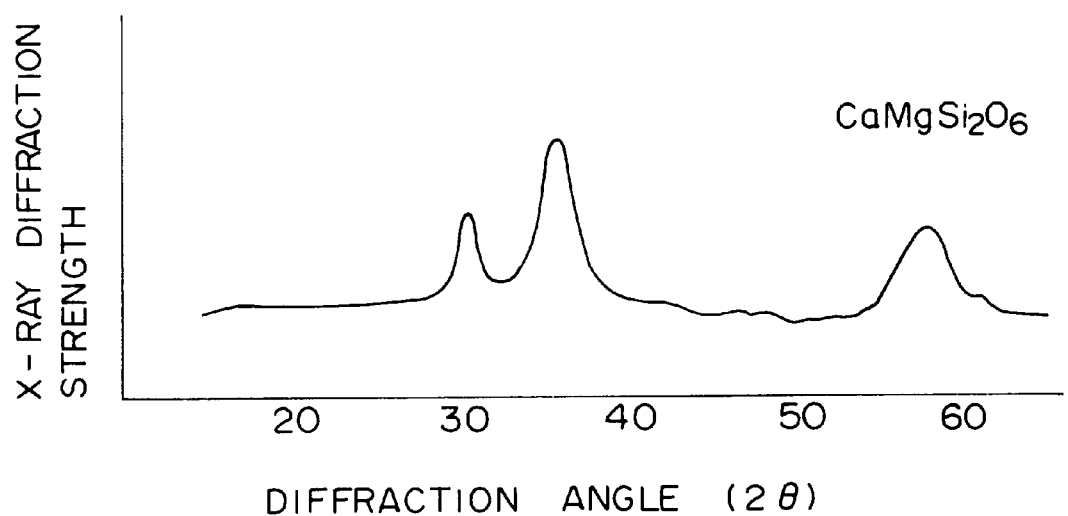
FIG. 8 is a graph showing an X-ray diffraction pattern of a film provided by thermal treatment of the protective film 5 of the magnetic head in FIGS. 1A and 1B.

Further, the specimen of the protective film 5 is heated at 700° C. for one hour and the above-mentioned X-ray diffraction measurement is executed. A diffraction line showing a crystal is observed in the vicinities of d=0.30 nm, 0.25 nm, and 0.16 nm, as shown in FIG. 8. This indicates that diopside crystal grains of average particle diameter 50–100 nm or so exist.

The magnetic head of the first embodiment uses the protective film 5 close to the substrate 1 in thermal expansion coefficient, thus there is little chance that a thermal history will cause the protective film 5 to peel off or a crack to occur on the protective film 5. Since the protective film 5 is close to the substrate 1 in hardness, it is difficult for partial abrasion of the slide face 101 to occur. Further, the protective film 5, which is high stability in water, is only slightly altered in quality even if the slide face 101 is polished with abrasive grains dispersed in an aqueous solvent. Therefore, the magnetic head of the embodiment has a high abrasion resistance characteristic of the slide face and can maintain stable recording and reproducing characteristics over a long period.

Since the film formation speed of the protective film 5 of the embodiment is faster than that of conventional protective film material such as alumina, the magnetic head of the embodiment is excellent in mass productivity and can be manufactured at low cost.

As described above, the first embodiment uses the amorphous protective film 5 containing microcluster of the inosilicate type structure in the atomic configuration with composition $CaMgSi_2O_6$, but is not limited to it. If a protective film 5 containing crystal grains of diopside is used, a similar effect can be produced. The protective film 5 containing crystal grains can be formed by thermal treatment of the protective film 5 containing microcluster as shown in FIG. 8.

Of course, a protective film 5 of a diopside crystal as a whole can also be used. In this case, the entire protective film 5 may be a monocrystal or polycrystal of diopside.

Also, the film formation conditions of the protective film 5 are changed in the ranges of 300 to 1000 W of sputter power and 0.01 to 2.0 Pa of Ar gas pressure. The structure and composition of the protective film 5 remain almost unchanged and the thermal expansion coefficient ranges from 105 to $113 \times 10^{-7}/°$ C. and the Vickers hardness ranges from 650 to $800/mm^2$.

A polycrystalline sinter target whose composition is changed within the composition range of $Ca_xMg_{2-x}Si_2O_6$ ($0.7 \leq X \leq 1.3$) is used as the target 7 for forming a protective film 5. Although the average composition of the protective film 5 changes due to the target composition change, the thermal expansion coefficient and Vickers hardness are almost the same as those when the polycrystalline sinter target 7 of $CaMgSi_2O_6$ is used.

A target composed of materials of CaO, MgO, $SiO_2$ exposed to the target surface in an area ratio of 1:1:2 can be used as the target 7 for forming the protective film 5. In this case, the composition of the protective film 5 can be controlled by changing the area ratios of the materials to be exposed to the target surface. The material exposure areas can be controlled by using a target whose surface is divided into regions of CaO, MgO, and $SiO_2$ composites or using a target provided by powdering CaO, MgO, and $SiO_2$ composites and blending and sintering them so as to make target composition.

Next, a magnetic head according to a second embodiment of the invention will be discussed.

The magnetic head of the embodiment uses a film containing Mg, Al, and O as a protective film 5. Moreover, the protective film 5 contains microclusters, each of which has a composition $MgAl_2O_4$ and a spinel type structure in the atomic configuration. The magnetic head of the second embodiment is the same as that of the first embodiment in other points and therefore will not be discussed again.

An amorphous material containing a region of composition of $MgAl_2O_4$ at least in a part thereof, wherein Mg atom is surrounded by O atoms coordination number of four and Al atom is surrounded by O atoms with coordination number of six in atomic configuration in said region of composition $MgAl_2O_4$.

The protective film 5 of the second embodiment is formed using a target of spinel (composition $MgAl_2O_4$) by the sputtering method as in the first embodiment.

The protective film 5 of the embodiment has a thermal expansion coefficient $80 \times 10^{-7}/°$ C. and Vickers hardness $1000–1150/mm^2$, which are values close to the thermal expansion coefficient $115 \times 10^{-7}/°$ C. and Vickers hardness $650/mm^2$ of $(Mn, Zn) Fe_2O_4$ of substrate 1.

Figure 21:
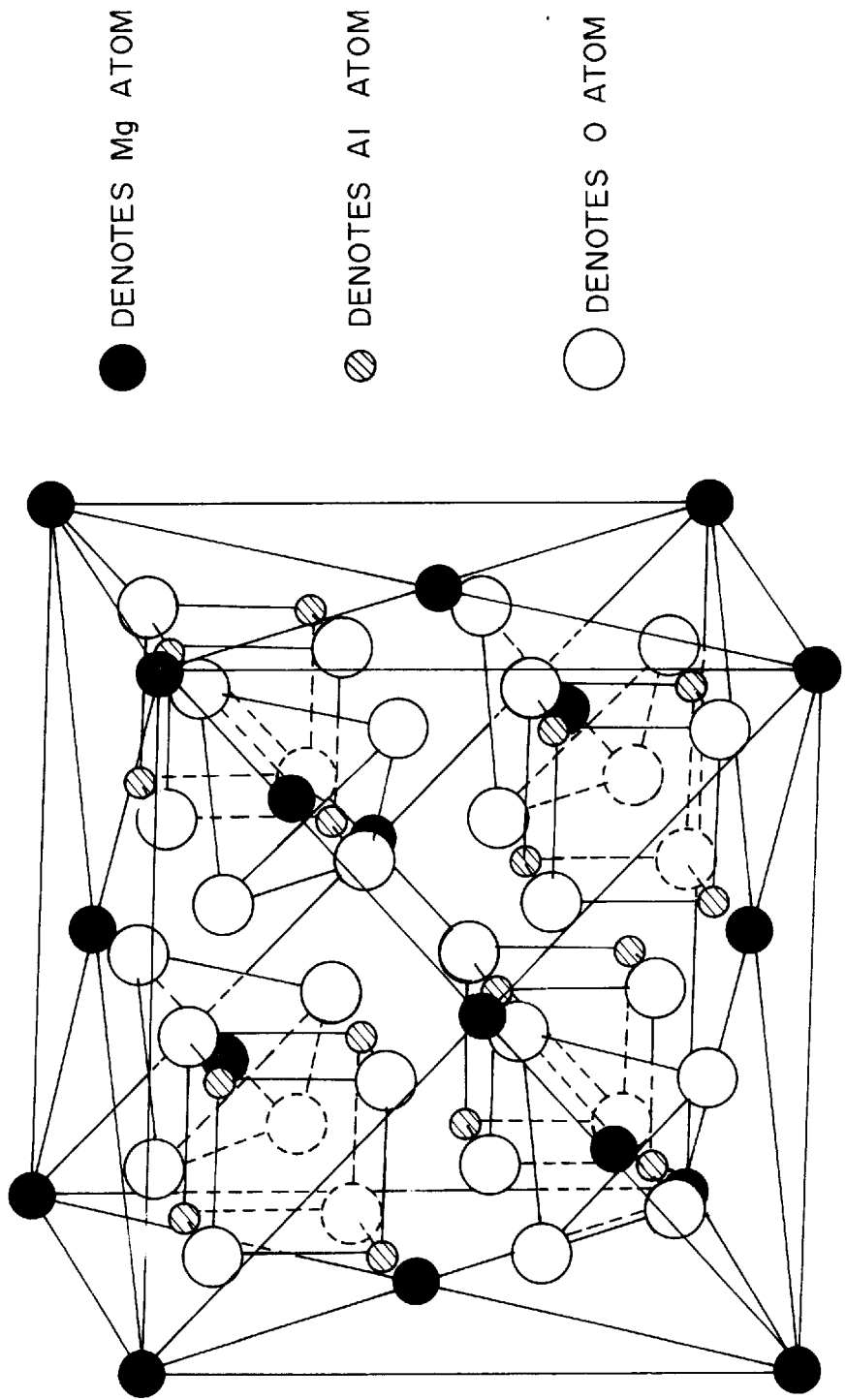
FIG. 21 is an illustration showing the structure of a microcluster contained in the protective film 5 according to the second embodiment of the invention.

The structure of the spinel type structure microcluster contained in the protective film 5 of the second embodiment will be further discussed with reference to FIG. 21. The microcluster takes the atomic configuration of the spinel type as shown in FIG. 21. Al is surrounded by six O atoms with the coordination number of six and Mg is surrounded by four O atoms with the coordination number of four.

When the protective film 5 of the second embodiment is measured by the X-ray diffraction method, no diffraction line is observed. Further, the structure of the protective film 5 is analyzed by the XAFS method.

Figure 10:
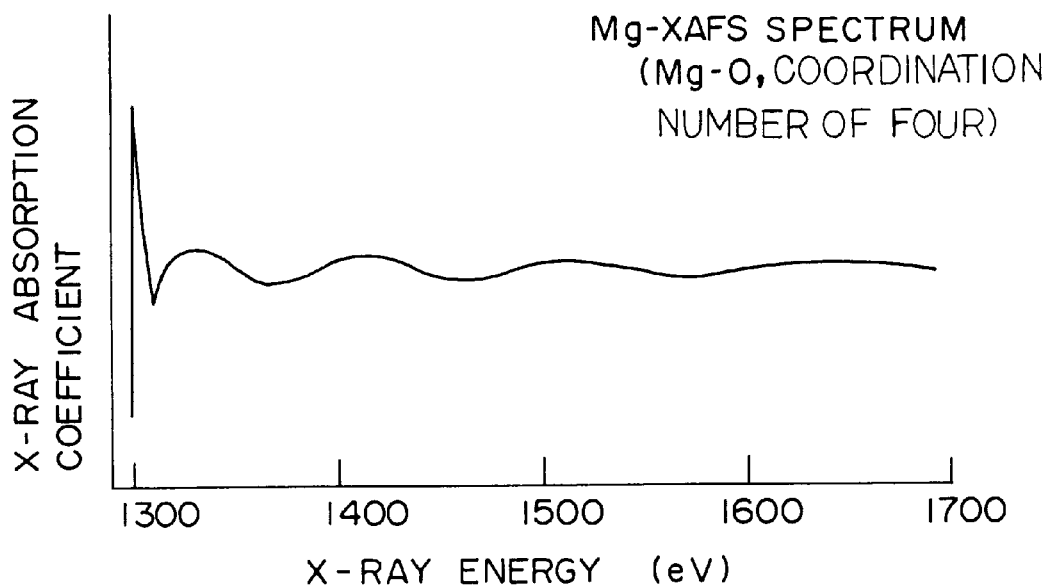
FIG. 10 is a graph showing the X-ray absorption spectrum of Mg atoms of a protective film 5 of a magnetic head according to a second embodiment of the invention.
Figure 12:
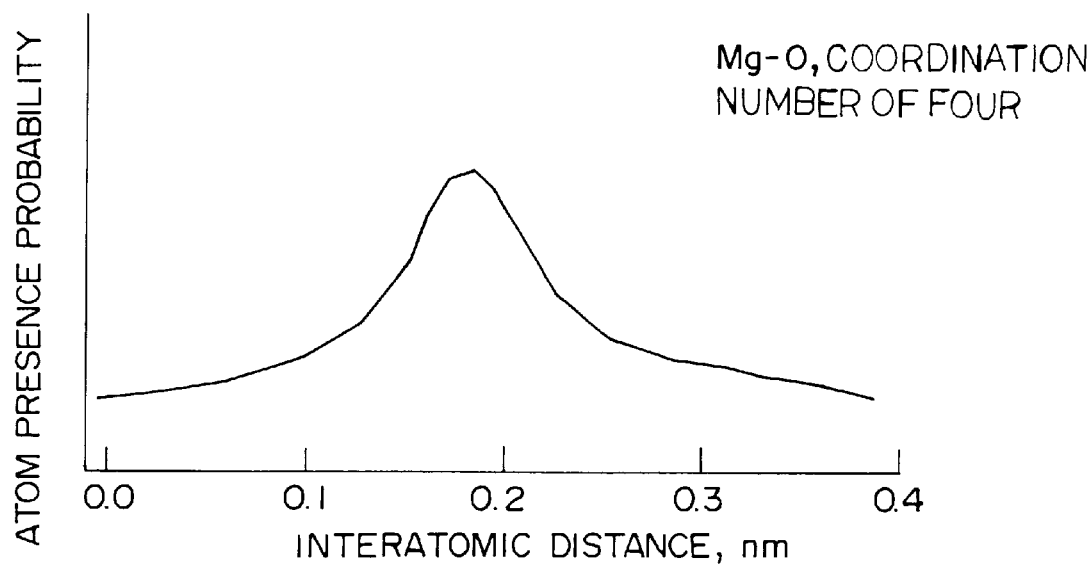
FIG. 12 is a graph showing the radial distribution of Mg atoms of the protective film 5 of the magnetic head according to the second embodiment of the invention.

FIG. 10 is a graph showing an X-ray absorption spectrum measured in the vicinity of the K-X-ray absorption edge of Mg for analyzing the surrounding structure of the Mg atom. The X-ray absorption spectrum in FIG. 10 is analyzed. FIG. 12 shows the analyses of a radial distribution centering on the Mg atom. The radial distribution in FIG. 12 indicates that Mg is connected to O atoms with the coordination number of four in the protective film 5 of the second embodiment.

Figure 11:
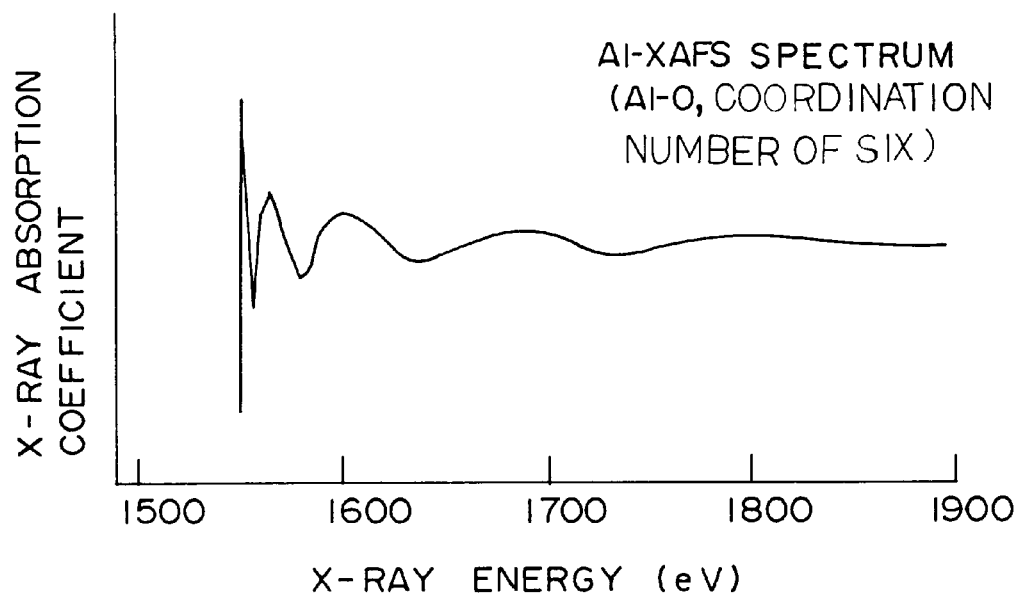
FIG. 11 is a graph showing the X-ray absorption spectrum of Al atom of the protective film 5 of the magnetic head according to the second embodiment of the invention.
Figure 13:
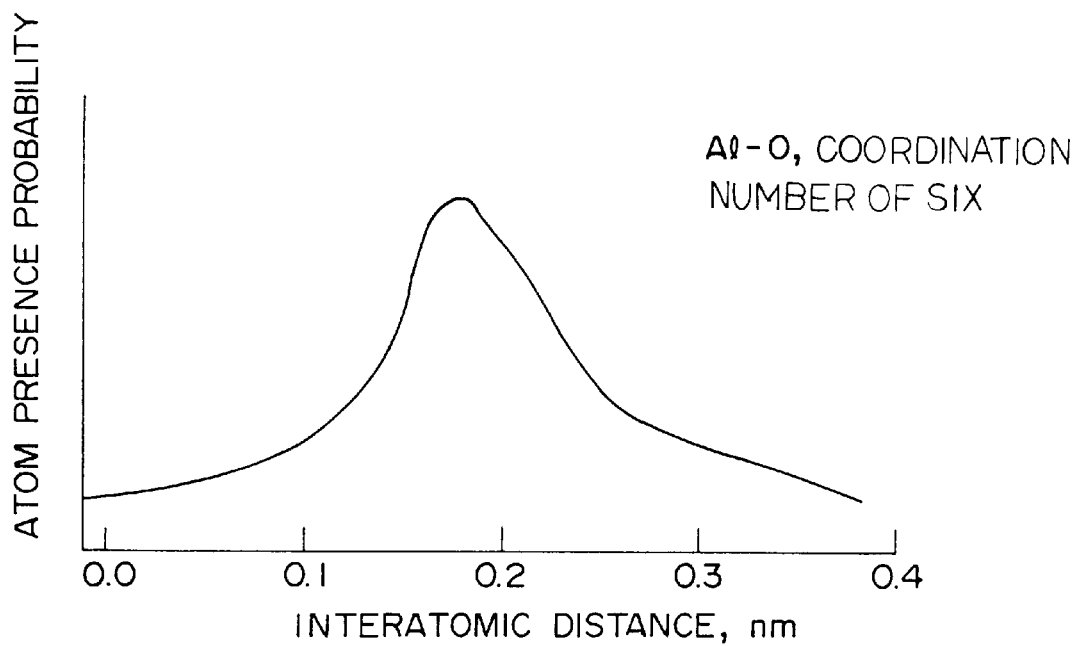
FIG. 13 is a graph showing the radial distribution of Al atoms of the protective film 5 of the magnetic head according to the second embodiment of the invention.

FIG. 11 is a graph showing an X-ray absorption spectrum measured in the vicinity of the K-X-ray absorption edge of Al for analyzing the surrounding structure of the Al atom. The X-ray absorption spectrum in FIG. 11 is analyzed. FIG. 13 shows the analyses of a radial distribution centering on the Al atom. The radial distribution in FIG. 13 indicates that Al is connected to O atoms with the coordination number of six in the protective film 5 of the second embodiment.

From the results, we observe that a microcluster of the spinel type structure with composition $MgAl_2O_4$ exists in the protective film 5 of the second embodiment.

Figure 20:
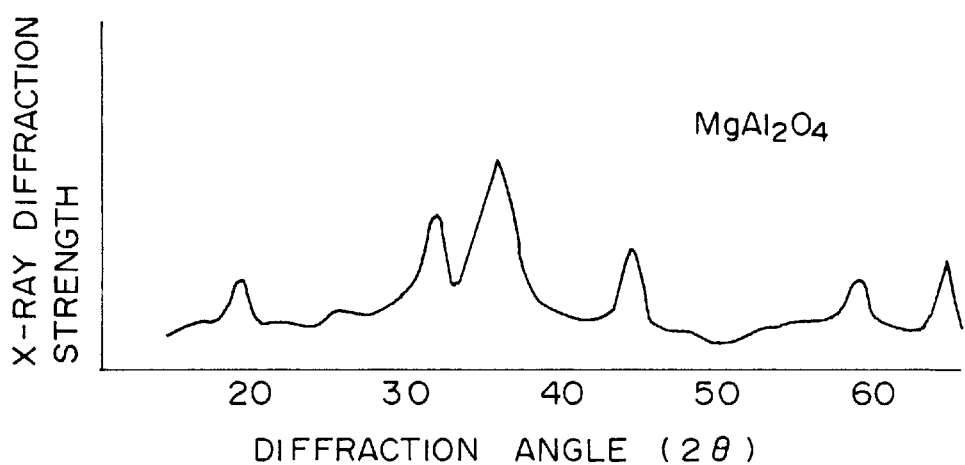
FIG. 20 is a graph showing an X-ray diffraction pattern of a film provided by thermal treatment of the protective film 5 of the magnetic head according to the second embodiment of the invention.

When thermal treatment of the protective film 5 of the second embodiment is executed and X-ray diffraction is measured, a diffraction line representing crystal grains of the structure shown in FIG. 21 with composition $MgAl_2O_4$ is found, as shown in FIG. 20. Therefore, it is apparent that the microcluster grows into crystal grains by the thermal treatment. The thermal expansion coefficient and Vickers hardness of the thermally treated protective film 5 of the second embodiment change little as compared with those before the thermal treatment. Therefore, the thermally treated protective film 5 of the second embodiment, which is also close to the substrate of the magnetic head in thermal expansion coefficient and Vickers hardness, can be used as a protective film of the magnetic head.

The magnetic head of the second embodiment uses the protective film 5 close to the substrate 1 in thermal expansion coefficient, thus there is little chance that a thermal history will cause the protective film 5 to peel off or a crack to occur on the protective film 5. Since the protective film 5 is close to the substrate in hardness, it is difficult for partial abrasion of the slide face 101 to occur. Therefore, the magnetic head of the embodiment has a high abrasion resistance characteristic at the slide face and can maintain stable recording and reproducing characteristics over a long period.

Next, a magnetic head according to a third embodiment of the invention will be discussed.

The magnetic head of the embodiment uses a film containing Ca, Mg, Si, and O as a protective film 5. Moreover, the protective film 5 contains two types of microclusters, one of which has composition $CaMgSi_2O_6$ and an inosilicate type structure in the atomic configuration and the other of which has composition, $Mg_2SiO_4$ and a nesosilicate type structure in the atomic configuration. The magnetic head of the third embodiment is the same as that of the first embodiment in other points and therefore will not be discussed again.

The protective film 5 of the third embodiment is formed using a target produced by blending and sintering diopside (composition $CaMgSi_2O_6$) and forsterite (composition $Mg_2SiO_4$) using the sputtering method, as in the first embodiment.

The protective film 5 of the embodiment has a thermal expansion coefficient of 105 to $110 \times 10^{-7}/°$ C. and Vickers hardness 700–900/mm$^2$, which are values close to the thermal expansion coefficient $115 \times 10^{-7}/°$ C. and a Vickers hardness of 650/mm$^2$ of (Mn, Zn) $Fe_2O_4$ of the substrate 1. The thermal expansion coefficient and hardness vary depending on the ratio between the microcluster of composition $CaMgSi_2O_6$ and the microcluster of composition $Mg_2SiO_4$ contained in the film. The higher the ratio of the microcluster of composition $CaMgSi_2O_6$ contained in the film, the closer the thermal expansion coefficient is to $105 \times 10^{-7}/°$ C. and the Vickers hardness to 700/mm$^2$; the higher the ratio of the microcluster of composition $Mg_2SiO_4$, the closer the thermal expansion coefficient is to $110 \times 10^{-7}/°$ C. and the Vickers hardness to 850–900/mm$^2$.

Figure 22:
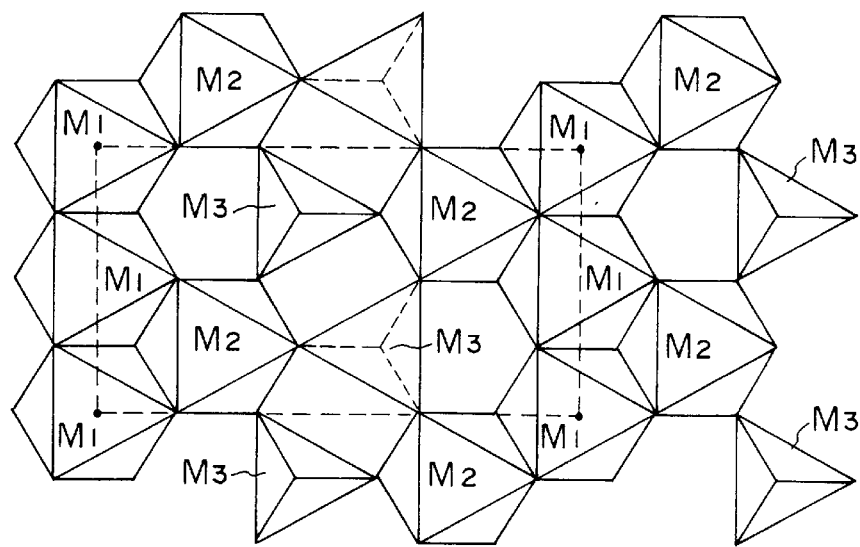
FIG. 22 is an illustration showing the structure of a microcluster contained in the protective film 5 according to the third embodiment of the invention.

In the structure of the inosilicate type structure microcluster contained in the protective film 5 of the third embodiment, as in the first embodiment, each Si atom is surrounded by four O atoms (the coordination number of four), each Ca atom is surrounded by eight O atoms (the coordination number of eight), and each Mg atom is surrounded by six O atoms (the coordination number of six), as shown in FIG. 3. In the structure of the nesosilicate type structure microcluster, each Mg atom is surrounded by six O atoms (the coordination number of six) and each Si atom is surrounded by four O atoms (the coordination number of four), as shown in FIG. 22.

Figure 18:
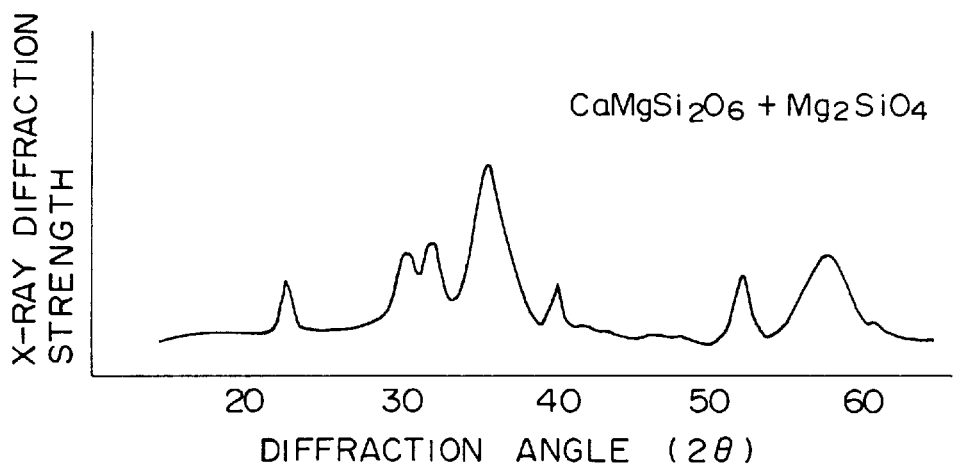
FIG. 18 is a graph showing an X-ray diffraction pattern of a film provided by thermal treatment of a protective film 5 of a magnetic head according to a third embodiment of the invention.

The structure of the protective film 5 of the third embodiment can be observed as described below:

First, when the film resulting from thermal treatment of the protective film 5 of the third embodiment is measured by the X-ray diffraction method, a diffraction line as shown in FIG. 18 is found. We observe that the diffraction line in FIG. 18 contains an X-ray diffraction line of a film containing diopside crystal grains shown in FIG. 8 and an X-ray diffraction line of a film containing forsterite crystal (crystal of nesosilicate type structure with composition $Mg_2SiO_4$) grains. Therefore, we can find that two types of crystal grains, into which the microcluster grow mix in the thermally treated protective film 5. The thermal expansion coefficient and hardness of the thermally treated protective film 5 change little compared with those before the thermal treatment. Therefore, the thermally treated protective film 5 can also be used with the magnetic head as a matter of course.

If the protective film 5 of the third embodiment is measured by the X-ray diffraction method and no diffraction line is observed, the structure can be observed by the XAFS method.

The two types of microclusters of the protective film 5 of the third embodiment differ in interatomic distance between Si and Mg atoms and that between Si and O atoms. Therefore, the radial distribution of Si of the film containing the two types of microclusters becomes a curve resulting from adding the radial distribution curve of Si of the film containing only the microcluster of $CaMgSi_2O_6$ (FIG. 23A) and the radial distribution curve of Si of the film containing only the microcluster of $Mg_2SiO_4$ (FIG. 23B), as shown in FIG. 23C. Thus, it can be observed that the protective film 5 contains the two types of microclusters by making XAFS analysis of the protective film 5 of the third embodiment for a numerical analysis of the Si radial distribution.

Figure 17:
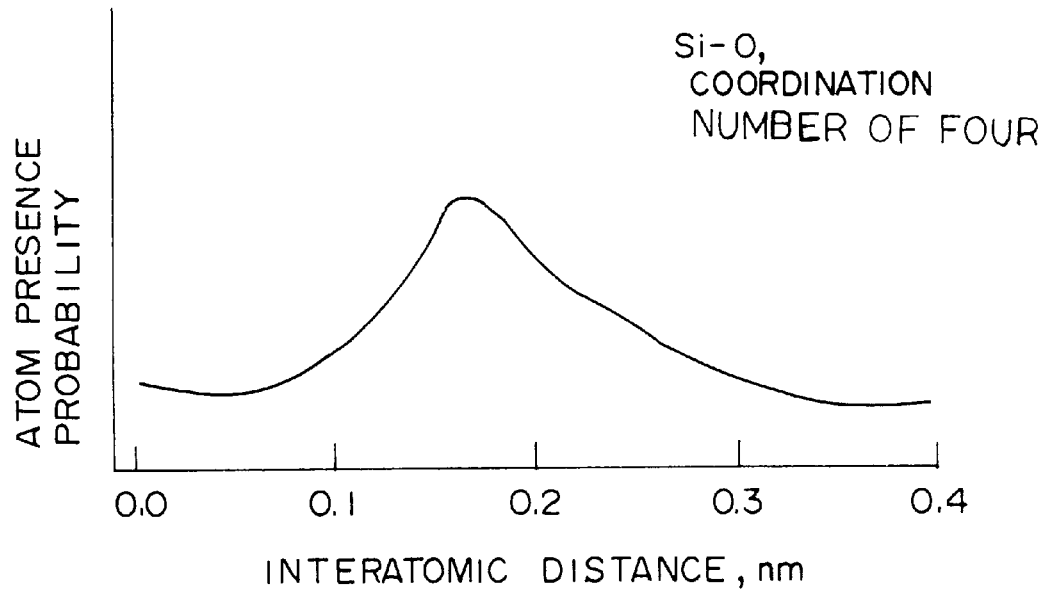
FIG. 17 is a graph showing the radial distribution of Si atoms of a film containing microcluster of nesosilicate type structure with composition $Mg_2SiO_4$.

The Si radial distribution of the film containing only the microcluster of $CaMgSi_2O_6$ in FIG. 23A is the same in detail as that already shown in FIG. 7. FIG. 17 shows the Si radial distribution of the film containing only the microcluster of $Mg_2SiO_4$ in FIG. 23B. As shown here, the peak of the Si radial distribution of $Mg_2SiO_4$ appears at 0.16 nm; as shown in FIG. 7, the peak of the Si radial distribution of $CaMgSi_2O_6$ also appears remarkably at 0.30 nm in addition to 0.16 nm. When two types of microclusters mix as the protective film 5 of the third embodiment, the radial distribution results from adding the radial distributions of the two types of microclusters. Therefore, the two types of microclusters can be separated by a numerical analysis for finding the blend ratio between the two types of microclusters.

Figure 14:
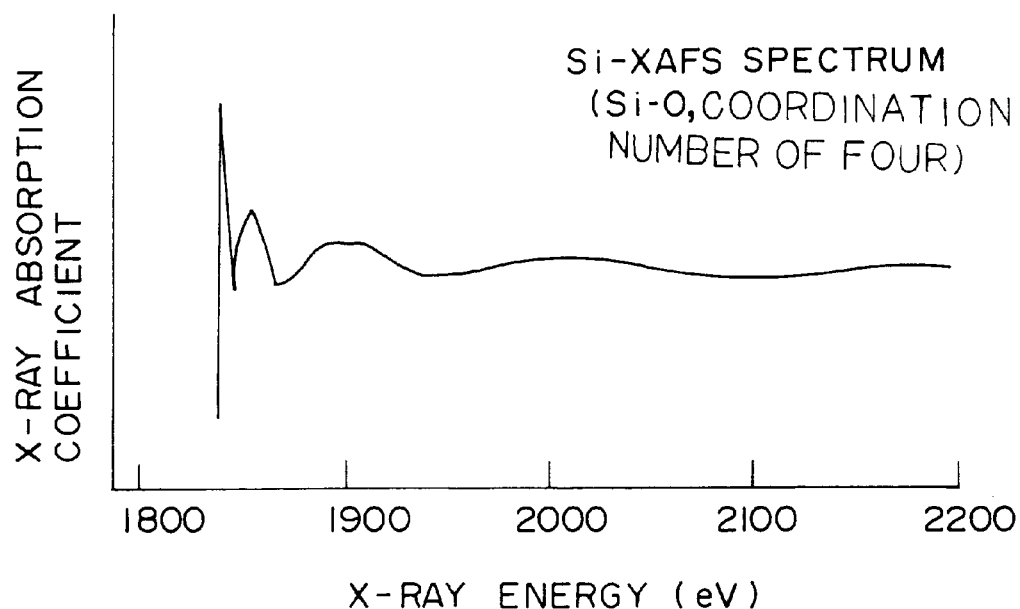
FIG. 14 is a graph showing the X-ray absorption spectrum of Si atoms of a film containing microcluster of nesosilicate type structure with composition $Mg_2SiO_4$.
Figure 15:
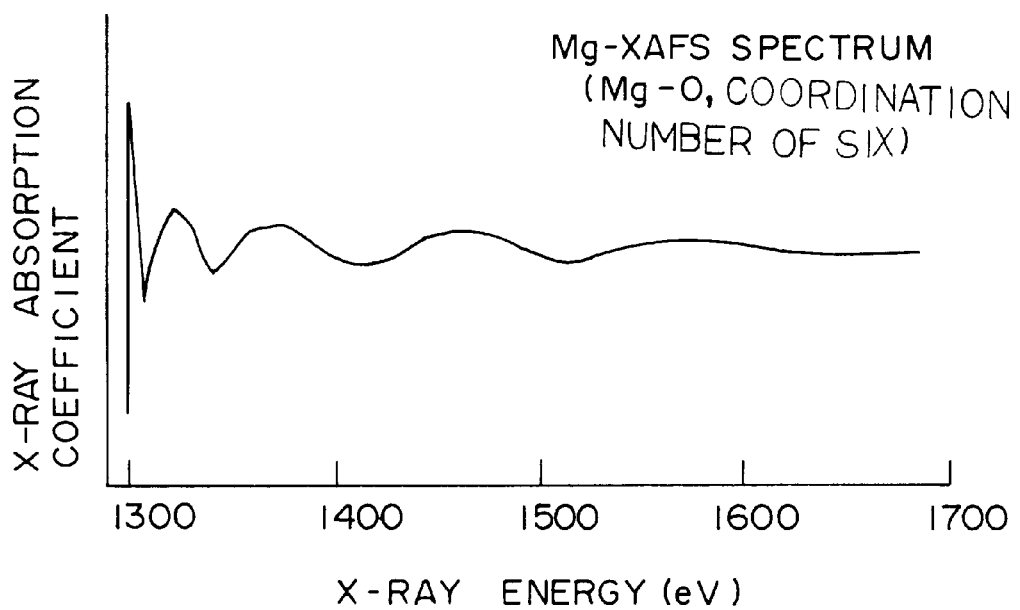
FIG. 15 is a graph showing the X-ray absorption spectrum of Mg atoms of a film containing microcluster of nesosilicate type structure with composition $Mg_2SiO_4$.
Figure 16:
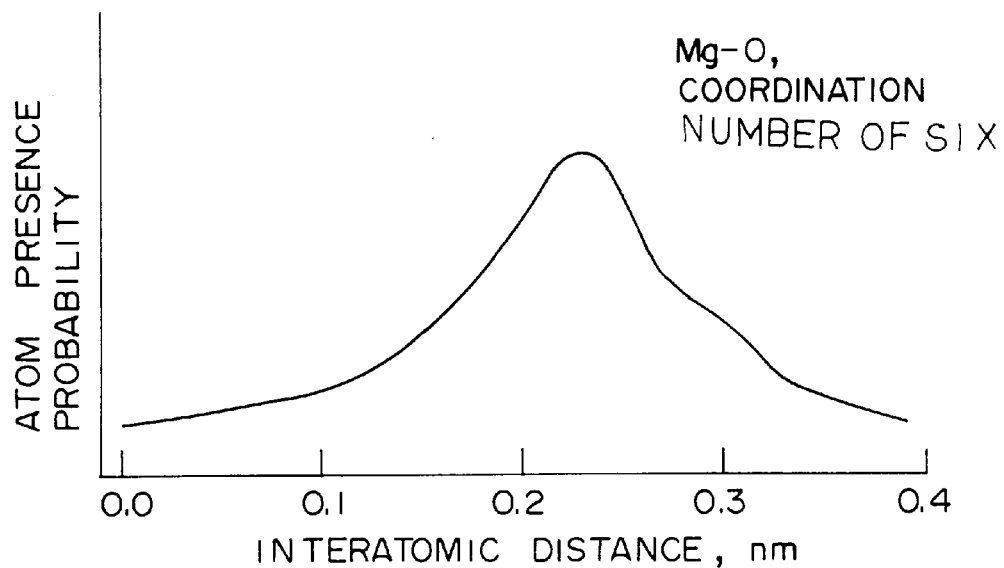
FIG. 16 is a graph showing the radial distribution of Mg atoms of a film containing microcluster of nesosilicate type structure with composition $Mg_2SiO_4$.

FIG. 16 shows the Mg radial distribution of the film containing only the microcluster of $Mg_2SiO_4$. It is apparent from FIG. 16 that Mg atom of the microcluster of $Mg_2SiO_4$ is connected to O atoms with the coordination number of six. However, since Mg atom of the microcluster of $CaMgSi_2O_6$ also is connected to O atoms with the coordination number of six, it is difficult to observe the presence of the two types of microclusters of the protective film 5 of the third embodiment from the Mg radial distribution. FIGS. 14 and 15 are graphs of the X-ray absorption spectra based on which the radial distributions in FIGS. 16 and 17 are found.

The magnetic head of the third embodiment uses the protective film 5 close to the substrate 1 in thermal expansion coefficient, thus there is little chance that a thermal history will cause the protective film 5 to peel off or a crack to occur on the protective film 5. Since the protective film 5 is close to the substrate in hardness, it is difficult for partial abrasion of the slide face 101 to occur. Therefore, the magnetic head of the embodiment has a high abrasion resistance characteristic of the slide face and can maintain stable recording and reproducing characteristics over a long period.

Next, a magnetic head according to a fourth embodiment of the invention will be discussed.

The magnetic head of the embodiment uses a film containing Mg, Al, Si, and O as a protective film 5. Moreover, the protective film 5 contains two types of microclusters, one of which has composition $MgAl_2O_4$ and spinel type structure in the atomic configuration and the other of which has composition $Mg_2SiO_4$ and nesosilicate type structure in the atomic configuration. The magnetic head of the third embodiment is the same as that of the first embodiment in other points and therefore will not be discussed again.

The protective film 5 of the fourth embodiment is formed using a target produced by blending and sintering spinel (composition $MgAl_2O_4$) and forsterite (composition $Mg_2SiO_4$) using the sputtering method as in the first embodiment.

The protective film 5 of the embodiment has a thermal expansion coefficient 80 to $110 \times 10^{-7}/°$ C. and a Vickers hardness 850–1150/mm$^2$, which are values close to the thermal expansion coefficient $115 \times 10^{-7}/°$ C. and Vickers hardness 650/mm² of (Mn, Zn) Fe$_2$O$_4$ of substrate 1. The thermal expansion coefficient and hardness vary depending on the ratio between the microcluster of composition MgAl$_2$O$_4$ and the microcluster of composition Mg$_2$SiO$_4$ contained in the protection film. The higher the ratio of the microcluster of composition MgAl$_2$O$_4$ contained in the film, the closer the thermal expansion coefficient to $80 \times 10^{-7}/°$ C. and the Vickers hardness to 1000 to 1150/mm²; the higher the ratio of the microcluster of composition Mg$_2$SiO$_4$, the closer the thermal expansion coefficient is to $110 \times 10^{-7}/°$ C. and Vickers hardness to 850–900/mm².

In the structure of the spinel type structure microcluster contained in the protective film 5 of the fourth embodiment, as in the second embodiment, each Mg atom is surrounded by four O atoms (the coordination number of four) and each Al atom is surrounded by six O atoms (the coordination number of six), as shown in FIG. 21. In the structure of the nesosilicate type structure microcluster, each Mg atom is surrounded by six O atoms (the coordination number of six) and each Si atom is surrounded by four O atoms (the coordination number of four), as shown in FIG. 22.

Figure 19:
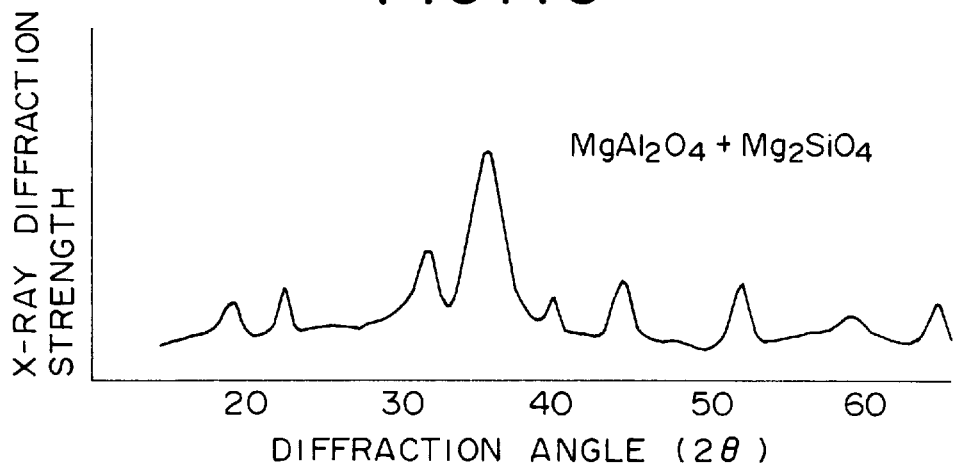
FIG. 19 is a graph showing an X-ray diffraction pattern of a film provided by thermal treatment of a protective film 5 of a magnetic head according to a fourth embodiment of the invention.

The structure of the protective film 5 of the fourth embodiment can be observed as described below:

First, when the film resulting from thermal treatment of the protective film 5 of the third embodiment is measured by the X-ray diffraction method, a diffraction line as shown in FIG. 19 is found. We observe that the diffraction line in FIG. 19 contains a diffraction line of a film containing spinel crystal grains shown in FIG. 20 and a diffraction line of a film containing forsterite crystal (crystal of nesosilicate type structure with composition Mg$_2$SiO$_4$) grains. Therefore, we can find that two types of crystal grains, into which the microcluster grows, mix in the thermally treated protective film 5. The thermal expansion coefficient and hardness of the thermally treated protective film 5 change only slightly compared with those before the thermal treatment. Therefore, the thermally treated protective film 5 can also be used with the magnetic head as a matter of course.

If the protective film 5 of the fourth embodiment is measured by the X-ray diffraction method and no diffraction line is observed, the structure can be observed by the XAFS method.

The microclusters of the protective film 5 of the fourth embodiment differ in O atom coordination number surrounding each Mg atom, as described above. The radial distribution of Mg of the film containing the two types of microclusters becomes a curve resulting from adding the radial distribution curve of Mg of the film containing only the microcluster of MgAl$_2$O$_4$ (FIG. 24A) and the radial distribution curve of Mg of the film containing only the microcluster of Mg$_2$SiO$_4$ (FIG. 24B), as shown in FIG. 24C. Thus, it can be observed that the protective film 5 contains the two types of microclusters by making XAFS analysis of the protective film 5 of the fourth embodiment for a numerical analysis of the Mg radial distribution.

The Mg radial distribution of the film containing only the microcluster of MgAl$_2$O$_4$ in FIG. 24A is the same in detail as that already shown in FIG. 12. The Mg radial distribution of the film containing only the microcluster of Mg$_2$SiO$_4$ in FIG. 24B is already shown in FIG. 16. The peak position of the Mg radial distribution of Mg$_2$SiO$_4$ in FIG. 16 differs from that of the Mg radial distribution of MgAl$_2$O$_4$ in FIG. 12. The Mg radial distribution of the film containing both types of microclusters has two peaks. Therefore, the presence of the two types of microclusters can be found from the number of peaks of the Mg radial distribution of the protective film 5 of the fourth embodiment. Further, the ratio between the two types of microclusters can be found by an accurate numerical analysis of the peaks.

The magnetic head of the fourth embodiment uses the protective film 5 close to the substrate 1 in thermal expansion coefficient, thus there is little chance that a thermal history will cause the protective film 5 to peel off or a crack to occur on the protective film 5. Since the protective film 5 is close to the substrate in hardness, it is difficult for partial abrasion of the slide face 101 to occur. Therefore, the magnetic head of the embodiment has a high abrasion resistance characteristic at the slide face and can maintain stable recording and reproducing characteristics over a long period.

If there is a need for further raising the surface hardness of the slide face 101 in the magnetic heads of the first to fourth embodiments, a film of extremely hard material such as SiO$_2$ or Al$_2$O$_3$ can be formed on the protective film to meet the demand. Such an extremely hard material has a thermal expansion coefficient of about 1 to $70 \times 10^{-7}/°$ C. and differs greatly from the magnetic thin film of the substrate 1 or the magnetic cores 2 in term of thermal expansion coefficient. Up to now, if a film of such an extremely hard material is formed, a crack or the like occurs on the material and it cannot be used for the intended purpose. However, the film of the material of the protective film of the embodiments and the film of the extremely hard material are formed on the slide face 101 as a multilayer film or functionally gradient material film, whereby a crack can be prevented and a magnetic head having a slide face of high hardness and abrasion resistance can be provided.

Further, the protective films 5 of the first to fourth embodiments can be used as protective films of magnetic recording heads for providing a magnetic recorder such as a tape recorder for high-density recording. The protective films 5 of the embodiments have the effect of improving durability of the recording sections.

Further, materials of the protective films 5 of the first to fourth embodiments can be used as materials of the nonmagnetic substrates 1, the nonmagnetic embedded members 3, and the gap films 4 of the magnetic cores 2 of the magnetic recording heads for providing magnetic recorders such as VTR and magnetic disk records. The materials of the embodiments can be used to form the substrates 1, the nonmagnetic embedded members 3, and the gap films resisting abnormal temperatures and water. At the same time, the protective films 5 are formed as the films of the embodiments, whereby the protective films 5, the substrates 1, the nonmagnetic embedded members 3, and the gap films 4 are made of the same material, thus solving the problem of stress, etc., caused by the physical property difference.

Materials of the protective films 5 of the first to fourth embodiments, which are insulating materials, can be used as insulation films for providing thin film resistors, circuit substrates, electrode chips, etc. The materials of the protective films 5, which have a small thermal expansion coefficient difference from substrates, can suppress flaking of a conductor circuit formed on the insulation film, as described below:

As a fifth embodiment of the invention, an example of using the protective films 5 of the first to fourth embodiments as protective films for magnetic heads will be discussed with reference to FIG. 25.

Figure 25:
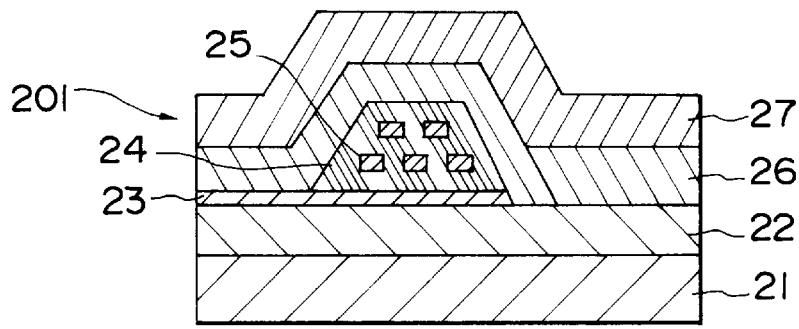
FIG. 25 is a sectional view showing the structure of a thin film magnetic head according to a fifth embodiment of the invention.

As shown in FIG. 25, a thin film magnetic head of the fifth embodiment comprises a lower magnetic core film 22, an upper magnetic core film 26, and a protective film 27 laminated in order on a nonmagnetic substrate 21. A gap film 23 is placed between the lower and upper magnetic core films 22 and 26 in the portion facing a slide face 201. A plurality of signal coil line films 25 enveloped in an insulation film 24 are placed between the gap film 23 and the upper magnetic core film 26.

The substrate 21 is made of the same material as the substrate 1 of the first embodiment. The upper and lower magnetic core films 26 and 22 are made of magnetic material. The protective film 27 is made of the same material as the protective film 5 of the first embodiment.

The protective film 5 protects the upper magnetic core film 26 from the top and also prevents abrasion of the slide face 201. As in the first embodiment, the protective film, which has a Vickers hardness equivalent to that of the substrate 21, prevents partial abrasion of the slide face 201. Therefore, the thin film magnetic head in FIG. 25 can provide stable recording and reproducing characteristics over a long period.

Next, a thin film resistor of a sixth embodiment of the invention will be discussed with reference to FIG. 26.

The thin film resistor of the sixth embodiment comprises a thermosetting resin thin film 32 and a metal resistance thin film 33 laminated in order around a ceramic substrate 31. A metal cap film 34 is furthermore laminated on each end of the metal resistance thin film 33, and a lead 35 is connected to each metal cap film 34. The whole is covered with an insulation film 36. In the embodiment, the insulation film 36 is made of the same material as the protective film 5 described in the first embodiment.

Figure 26:
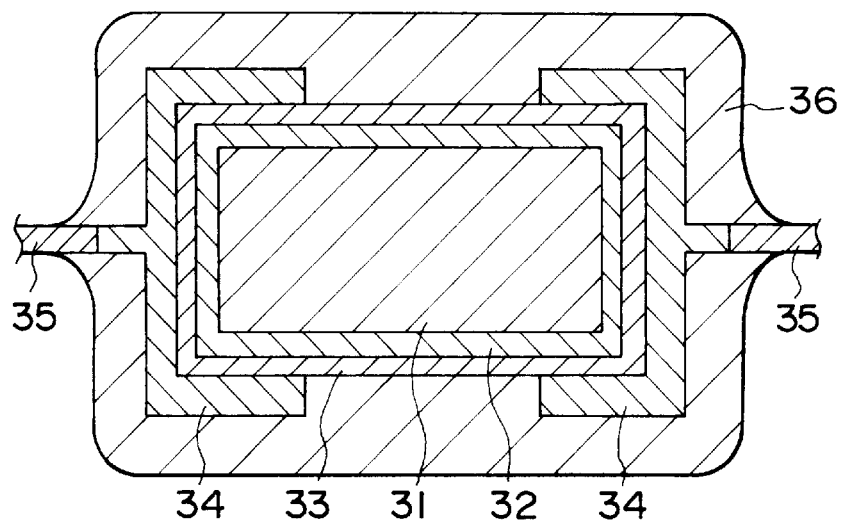
FIG. 26 is a sectional view showing the structure of a thin film resistor according to a sixth embodiment of the invention.

The operation of the thin film resistor in FIG. 26 will be simply discussed. A current supplied from one lead 35 flows through the metal cap film 34, the metal resistance thin film 33 of large resistance, the other metal cap 34, and the other lead 35 into an external circuit. Therefore, the thin film resistor in FIG. 26, which contains the metal resistance thin film 33 having a large resistance value, shows a large resistance value. When an over current flows into the metal resistance thin film 33, the thermosetting resin thin film 32 expands due to heat generated from the metal resistance thin film 33 and shuts off the resistance thin film 33.

The material of the insulation film 36 is stable in water as shown in the first embodiment and moreover can resist high-temperature thermal treatment at 700° C. or more. Thus the insulation film 36 can reliably insulate current flowing into the internal resistance thin film 33, etc., from the outside. Since the insulation film 38 can be formed easily and at high speed by the thin film formation technology, the thin film resistor can be manufactured at low costs.

Next, a thermal printer head will be discussed as a seventh embodiment of the invention with reference to FIG. 27.

Figure 27:
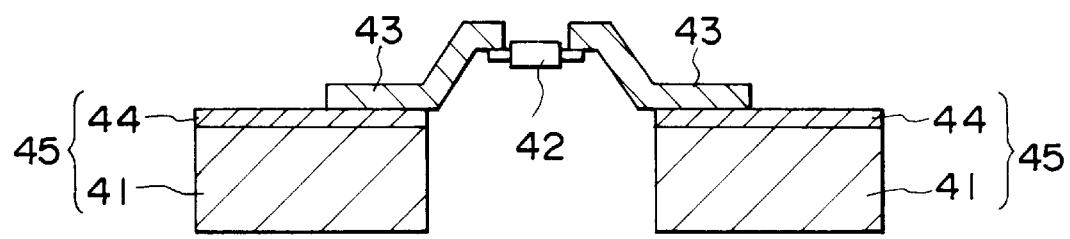
FIG. 27 is an illustration of a thermal printer head according to a seventh embodiment of the invention.

As shown in FIG. 27, the thermal printer head of the seventh embodiment comprises an integrated circuit 42 having a heating circuit, conductive films 43 for transferring an electric signal to the integrated circuit 42, and circuit substrates 45 for transferring an electric signal to the conductive films 43. The circuit substrate 45 comprises a signal line layer 44 printed on the substrate 41.

In the embodiment, the substrate 41 is made of the material of the protective film 5 described in the first embodiment. As discussed in the first embodiment, the material of the protective film 5 is stable in water. Thus, even when it is subjected to physical and scientific washing performed when the signal line layer 44 is formed, the structure is stable and the substrate 41 degrades only very slightly. Therefore, it can provide a highly reliable circuit substrate, also improving the reliability of the thermal printer head.

A circuit substrate according to an eighth embodiment of the invention will be discussed with reference to FIG. 28.

Figure 28:
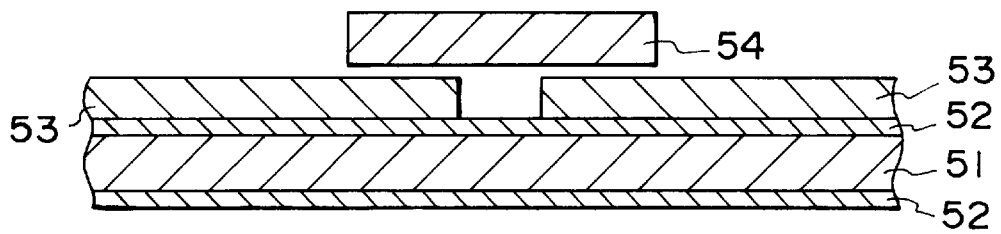
FIG. 28 is an illustration of a circuit substrate according to an eighth embodiment of the invention.

As shown in FIG. 28, the circuit substrate comprises a ceramic thin film 52 on each face of a base film 51 and a conductor circuit layer 53 is further placed on the upper ceramic thin film 52. A semiconductor chip 54 is mounted on the conductor circuit layer 53. A signal is input to and output from the semiconductor chip 54 through the conductor circuit layer 53.

In the embodiment, the film made of the material used in the protective film 5 shown in the embodiment 1, is used as the ceramic thin film 52. The film has, as stated above, high stability in water, so that it prevents the base film 51 from humidity and abrasion, and prevents it from expanding and contracting. The reliability of the conductor circuit layer 53 is maintained.

A ferroelectric memory according to a ninth embodiment of the invention will be discussed with reference to FIG. 29.

Figure 29:
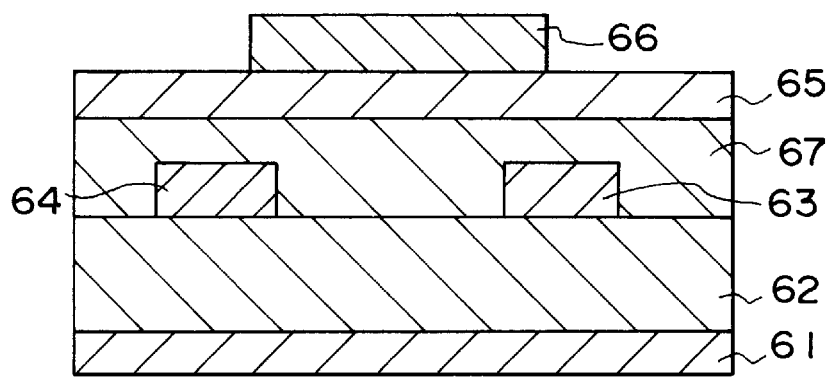
FIG. 29 is a sectional view of a ferroelectric memory according to a ninth embodiment of the invention.

The ferroelectric memory in FIG. 29 comprises a ferroelectric layer 62, a semiconductor layer 67 adjoining it, and a source film 64 and a drain film 63 disposed on the side of the semiconductor layer 67 on the boundaries between the two layers. A gate electrode film 66 is placed on the semiconductor layer 67 via a gate insulation film 65. A gate electrode film 61 is placed under the ferroelectric layer 62.

When a voltage is applied between the gate electrodes 61 and 66, a channel layer where the conduction electron density increases is formed on the gate insulation film 65 side of the semiconductor layer 67. The ferroelectric layer 62 has the semiconductor layer 67 side polarized to negative and the gate electrode film 61 side polarized to positive.

When a voltage is applied between the source layer 64 and the drain film 63 in this state, a drain current flows through the channel layer.

When the voltage between the gate electrode films 61 and 66 is shut off, the carrier layer disappears, but the polarization of the ferroelectric layer 62 is maintained, so that electric charges on the boundaries of the ferroelectric layer 62 move and the drain current between the source film 64 and the drain film 63 flows through the ferroelectric layer 62.

Therefore, if gate voltage is applied and information is input and then the gate voltage is shut off, the ferroelectric memory can hold the information.

In the embodiment, the fact that the protective film 5 of the first embodiment shows a dielectric constant of about 8 is utilized and the ferroelectric memory in FIG. 29 is made of the material.

A liquid crystal display using thin film transistors will be discussed as a tenth embodiment of the invention.

Figure 30:
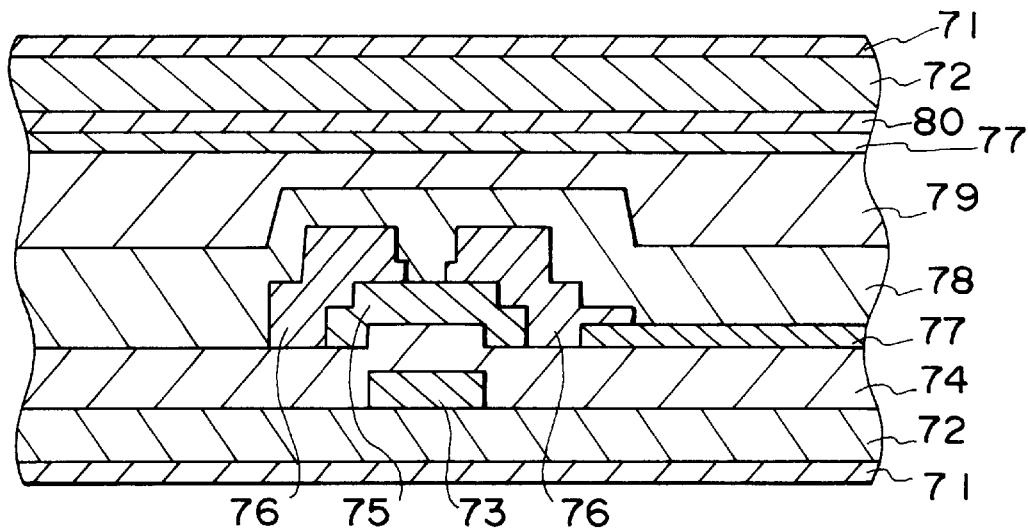
FIG. 30 is a sectional view showing the structure of a liquid crystal display according to a tenth embodiment of the invention.

As shown in FIG. 30, the transmission type liquid crystal display comprises glass substrates 72, a polarization plate 71, a color filter layer 80, transparent electrodes 77, and liquid crystal 79. It contains built-in thin film transistors as a drive circuit. The thin film transistor is made up of an insulation layer 78, signal electrode layers 76, a semiconductor layer 75, a gate insulation film 74, and a gate electrode film 73.

Since the inosilicate containing the diopside described in the above-mentioned embodiments is an insulating material, the insulation layer 78 is made of the material, thereby providing a liquid crystal display using the material.

As described above, the materials of the protective films of the invention are equivalent to the substrates of the magnetic heads in thermal expansion coefficient and hardness. Moreover, the protective films provide high stability in water and are formed at high speed. Therefore, magnetic heads of higher performance and having more excellent productivity than the former magnetic heads can be provided. They have very high industrial value.

What is claimed is:

1. A magnetic head comprising:
   a magnetic member whose physical quantity changes with magnetization of a recording medium;
   a converter for converting a physical quantity change of said magnetic member into an electrical signal;
   a substrate for supporting said magnetic member and said converter; and
   a protective film disposed on at least a part of a face of said substrate opposed to the recording medium,
   said protective film containing an amorphous microcluster region of composition $CaMgSi_2O_6$ at least in a part thereof, wherein Ca atom is surrounded by O atoms with coordination number of eight, Mg atom is surrounded by O atoms with coordination number of six, and Si atom is surrounded by O atoms with coordination number of four in atomic configuration in said amorphous microcluster region.

2. The magnetic head as claimed in claim 1 wherein said protective film further contains a region of composition $Mg_2SiO_4$, wherein Mg atom is surrounded by O atoms with coordination number of six and Si atom is surrounded by O atoms with coordination number of four in atomic configuration in said region of composition $Mg_2SiO_4$.

3. The magnetic head as claimed in claim 1 wherein said substrate is made of ferrite.

4. The magnetic head as claimed in claim 1 wherein said substrate is made of ceramics.

5. A magnetic head comprising:
   a magnetic member whose physical quantity changes with magnetization of a recording medium;
   a converter for converting a physical quantity change of said magnetic member into an electrical signal;
   a substrate for supporting said magnetic member and said converter; and
   a protective film disposed on at least a part of a face of said substrate positioned opposite to the recording medium,
   said protective film containing an amorphus microcluster region of composition $MgAl_2O_4$ at least in a part thereof, wherein Mg atom is surrounded by O atoms with coordination number of four and Al atom is surrounded by O atoms with coordination number of six in atomic configuration in said amorphus microcluster region of composition $MgAl_2O_4$.

6. The magnetic head as claimed in claim 5 wherein said protective film further contains a region of composition $Mg_2SiO_4$, wherein Mg atom is surrounded by O atoms with coordination number of six and Si atom is surrounded by O atoms with coordination number of four in atomic configuration in said region of composition $Mg_2SiO_4$.

7. The magnetic head as claimed in claim 5 wherein said substrate is made of ferrite.

8. The magnetic head as claimed in claim 5 wherein said substrate is made of ceramics.

9. A magnetic head unit comprising a plurality of magnetic heads, a rotation body mounted so as to expose said magnetic heads to a side, a signal transfer circuit for transferring an electrical signal of said magnetic heads, and a rotation drive section for rotating said rotation body,
   each of said magnetic heads comprising:
   a magnetic member whose physical quantity changes with magnetization of a recording medium;
   a converter for converting a physical quantity change of said magnetic member into an electrical signal;
   a substrate for supporting said magnetic member and said converter; and
   a protective film disposed on at least a part of a face of said substrate opposed to the recording medium,
   said protective film containing an amorphous microcluster region of composition $CaMgSi_2O_6$ at least in a part thereof, wherein Ca atom is surrounded by O atoms with coordination number of eight, Mg atom is surrounded by O atoms with coordination number of six, and Si atom is surrounded by O atoms with coordination number of four in atomic configuration in said amorphous microcluster region of composition $CaMgSi_2O_6$.

10. The magnetic head unit as claimed in claim 9 wherein said protective film further contains a region of composition $Mg_2SiO_4$, wherein Mg atom is surrounded by O atoms with coordination number of six and Si atom is surrounded by O atoms with coordination number of four in atomic configuration in said region of composition $Mg_2SiO_4$.

11. A magnetic head unit comprising a plurality of magnetic heads, a rotation body mounted so as to expose said magnetic heads to a side, a signal transfer circuit for transferring an electrical signal of said magnetic heads, and a rotation drive section for rotating said rotation body,
    each of said magnetic heads comprising:
    a magnetic member whose physical quantity changes with magnetization of a recording medium;
    a converter for converting a physical quantity change of said magnetic member into an electrical signal;
    a substrate for supporting said magnetic member and said converter; and
    a protective film disposed on at least a part of a face of said substrate opposed to the recording medium,
    said protective film containing an amorphous microcluster region of composition $MgAl_{2O4}$ at least in a part thereof, wherein Mg atom is surrounded by O atoms with coordination number of four and Al atom is surrounded by O atoms with coordination number of six in atomic configuration in said amorphous microcluster region of composition $MgAl_2O_4$.

12. The magnetic head unit as claimed in claim 11 wherein said protective film further contains a region of composition $Mg_2SiO_4$, wherein Mg atom is surrounded by O atoms with coordination number of six and Si atom is surrounded by O atoms with coordination number of four in atomic configuration in said region of composition $Mg_2SiO_4$.

13. A magnetic tape reproducing apparatus comprising:
    a run drive section for running a magnetic tape;
    a plurality of magnetic heads;
    a rotation body mounted so as to expose said magnetic heads to a side;
    a signal transfer circuit for transferring an electrical signal of said magnetic heads;
    a rotation drive section for rotating said rotation body;
    a control section for controlling said run drive section and said rotation drive section; and
    a signal processing section for processing the electrical signal transferred by said signal transfer circuit,
    each of said magnetic heads comprising:
    a magnetic member whose physical quantity changes with magnetization of a recording medium;
    a converter for converting a physical quantity change of said magnetic member into an electrical signal;

a substrate for supporting said magnetic member and said converter; and a protective film disposed on at least a part of a face of said substrate opposed to the recording medium, said protective film containing an amorphous microcluster region of composition $CaMgSi_2O_6$ at least in a part thereof, wherein Ca atom is surrounded by O atoms with coordination number of eight, Mg atom is surrounded by O atoms with coordination number of six, and Si atom is surrounded by O atoms with coordination number of four in atomic configuration in said amorphous microcluster region of composition $CaMgSi_2O_6$.

14. The magnetic tape reproducing apparatus as claimed in claim 13 wherein said protective film further contains a region of composition $Mg_2SiO_4$, wherein Mg atom is surrounded by O atoms with coordination number of six and Si atom is surrounded by O atoms with coordination number of four in atomic configuration in said region of composition $Mg_2SiO_4$.

15. A magnetic tape reproducing apparatus comprising:

a run drive section for running a magnetic tape;

a plurality of magnetic heads;

a rotation body mounted so as to expose said magnetic heads to a side;

a signal transfer circuit for transferring an electrical signal of said magnetic heads;

a rotation drive section for rotating said rotation body;

a control section for controlling said run drive section and said rotation drive section; and a signal processing section for processing the electrical signal transferred by said signal transfer circuit, each of said magnetic heads comprising:

a magnetic member whose physical quantity changes with magnetization of a recording medium;

a converter for converting a physical quantity change of said magnetic member into an electrical signal;

a substrate for supporting said magnetic member and said converter; and a protective film disposed on at least a part of a face of said substrate opposed to the recording medium, said protective film containing an amorphous microcluster region of composition $MgAl_2O_4$ at least in a part thereof, wherein Mg atom is surrounded by O atoms with coordination number of four and Al atom is surrounded by O atoms with coordination number of six in atomic configuration in said amorphous microcluster region of composition $MgAl_2O_4$.

16. The magnetic tape reproducing apparatus as claimed in claim 15 wherein said protective film further contains a region of composition $Mg_2SiO_4$, wherein Mg atom is surrounded by O atoms with coordination number of six and Si atom is surrounded by O atoms with coordination number of four in atomic configuration in said region of composition $Mg_2SiO_4$.

* * * * *